US012787571B2

(12) United States Patent
Luo

(10) Patent No.: US 12,787,571 B2
(45) Date of Patent: *Nov. 3, 2026

(54) DISPLAY PANEL

(71) Applicant: Xiamen Tianma Micro-Electronics Co., Ltd., Xiamen (CN)

(72) Inventor: Yaqin Luo, Wuhan (CN)

(73) Assignee: Xiamen Tianma Micro-Electronics Co., Ltd., Xiamen (CN)

( * ) Notice: Subject to any disclaimer, the term of this patent is extended or adjusted under 35 U.S.C. 154(b) by 400 days.

This patent is subject to a terminal disclaimer.

(21) Appl. No.: 18/372,240

(22) Filed: Sep. 25, 2023

(65) Prior Publication Data

US 2024/0016013 A1 Jan. 11, 2024

Related U.S. Application Data

(63) Continuation of application No. 17/234,295, filed on Apr. 19, 2021, now Pat. No. 11,778,876.

(30) Foreign Application Priority Data

Dec. 30, 2020 (CN) ........................ 202011615901.3

(51) Int. Cl.
*H10K 59/131* (2023.01)
*H10K 59/121* (2023.01)
*H10K 59/35* (2023.01)

(52) U.S. Cl.
CPC ......... *H10K 59/131* (2023.02); *H10K 59/121* (2023.02); *H10K 59/353* (2023.02)

(58) Field of Classification Search
CPC .................................................... H10K 59/131
See application file for complete search history.

(56) References Cited

U.S. PATENT DOCUMENTS 11,778,876 B2 * 10/2023 Luo ...................... H10K 59/353 257/40
2015/0002553 A1 * 1/2015 Chang .................. G09G 3/3607 345/88
2017/0125506 A1 * 5/2017 Kim .................. H10D 30/6723

FOREIGN PATENT DOCUMENTS

CN 108470751 A 8/2018
CN 111025710 A 4/2020

* cited by examiner

*Primary Examiner* — Douglas M Menz
(74) *Attorney, Agent, or Firm* — KDW FIRM PLLC

(57) ABSTRACT

Disclosed is a display panel. The display panel includes multiple sub-pixels and multiple data signal lines. The multiple sub-pixels constitute multiple sub-pixel columns; a sub-pixel column includes multiple sub-pixels arranged in sequence; at least three adjacent sub-pixels form a pixel unit; and colors of sub-pixels in the pixel unit include red, green and blue; at least part of sub-pixels belonging to a same sub-pixel column share one data signal line; where a data signal line electrically connected to red sub-pixels is different from a data signal line electrically connected to blue sub-pixels, and a data signal line electrically connected to green sub-pixels is different from the data signal line electrically connected to the blue sub-pixels.

13 Claims, 18 Drawing Sheets

DISPLAY PANEL

CROSS-REFERENCE TO RELATED APPLICATION

This is a Continuation application of US patent application U.S. Ser. No. 17/234,295, which claims priority to Chinese patent application No. 202011615901.3 filed Dec. 30, 2020, the disclosures of which are incorporated herein by reference in their entireties.

TECHNICAL FIELD

Embodiments of the present disclosure relate to the field of display technologies, and in particular, to a display panel and a display device.

BACKGROUND

With the development of display technologies, the requirement on the display quality of a display is increasingly high. Usually, sub-pixels of different colors are arranged in the display, such that the display can present colorful pictures. Light emitting materials adopted by the sub-pixels of different colors are different, and luminous efficiencies of different light emitting materials are different. The lower the luminous efficiency, the larger the light emitting current required by the sub-pixel, while the higher the luminous efficiency, the smaller the light emitting current required by the sub-pixel. For example, the luminous efficiency of the light emitting material of a blue sub-pixel is lower than the luminous efficiency of the light emitting material of a red sub-pixel and the luminous efficiency of the light emitting material of a green sub-pixel, such that the blue sub-pixel may have a same level of light emitting luminance as the red sub-pixel and the green sub-pixel only by requiring a relatively large light emitting current. Therefore, it is necessary to provide different data signals to the blue sub-pixel and sub-pixels of other colors (red and green), causing the blue sub-pixel and the sub-pixels of other colors (red and green) to exhibit the same level of light emitting luminance. When the blue sub-pixel shares a data signal line with the red sub-pixel and/or the green sub-pixel, the voltages of data signals transmitted by the data signal line need to jump continuously, such that both the requirement of the light emitting luminance of the blue sub-pixel and the requirements of the light emitting luminance of the red sub-pixel and/or the green sub-pixel can be satisfied.

However, when the data signals transmitted by the data signal line jump continuously, the data signals on this data signal line have a certain loss in a jump process, and especially when the voltage jump is relatively large, the loss is relatively significant, such that the data signals transmitted by the data signal line are distorted, and thus the display quality of the display is affected.

SUMMARY

Embodiments of the present disclosure provide a display panel and a display device, such that each data signal line may accurately transmit data signals to corresponding sub-pixels, and thus the display uniformity of the display panel is ensured and the display effect of the display panel is improved.

An embodiment of the present disclosure provides a display panel, and the display panel includes multiple sub-pixels and multiple data signal lines; where the multiple sub-pixels constitute multiple sub-pixel columns; a sub-pixel column includes multiple sub-pixels arranged in sequence; at least three adjacent sub-pixels form a pixel unit; and colors of sub-pixels in each pixel unit include red, green and blue; where a data signal line electrically connected to red sub-pixels is different from a data signal line electrically connected to blue sub-pixels, and a data signal line electrically connected to green sub-pixels is different from the data signal line electrically connected to the blue sub-pixels.

An embodiment of the present disclosure provides a display device, and the display device includes multiple sub-pixels and multiple data signal lines; wherein at least three adjacent sub-pixels form a pixel unit, and sub-pixels in a same pixel unit comprises a first sub-pixel, a second sub-pixel and a third sub-pixel; where at least part of sub-pixels which belong to a same sub-pixel column and have a same color share one data signal line; or, at least part of first sub-pixels belonging to a same sub-pixel column share one data signal line, at least part of second sub-pixels belonging to a same sub-pixel column share one data signal line.

An embodiment of the present disclosure provides a display device, and the display device includes multiple sub-pixels and multiple pixel circuits; wherein the multiple sub-pixels comprises a first sub-pixel, a second sub-pixel and a third sub-pixel, the multiple pixel circuit comprises a first pixel circuit, a second pixel circuit, and a third pixel circuit, the first sub-pixel is electrically connected to the first pixel circuit, the second sub-pixel is electrically connected to the second pixel circuit, and the third sub-pixel is electrically connected to the third pixel circuit, the first pixel circuit and the second pixel circuit are disposed to be symmetric in structure, and the first pixel circuit and the third pixel circuit are disposed to be symmetric in structure.

According to the display panel and the display device provided by the embodiments of the present disclosure, the blue sub-pixels, the red sub-pixels and the green sub-pixels do not share one data signal line, so it can be prevented that the voltages on the data signal line jump continuously when the blue sub-pixel and the red sub-pixel and/or the green sub-pixel share one data signal line, because the voltage of a data signal of the blue sub-pixel is quite different from the voltage of a data signal of the red sub-pixel and the voltage of a data signal of the green sub-pixel, thereby preventing the accuracy of the data signal transmitted by the data signal line from being affected. In particular, in a process of an aging test, the blue sub-pixels, the red sub-pixels and the green sub-pixels do not share the data signal line, such that when data signals on data signal lines are accurately transmitted to the sub-pixels, the sub-pixels can have the same or similar light emitting degree and thus have the same or similar aging degree. Therefore, it can be guaranteed that pixel units of the display panel at different positions have the same light emitting degree in a display stage after the aging test stage. Thus, the display uniformity of the display panel can be guaranteed during subsequent display, and the display effect of the display panel can be improved.

DETAILED DESCRIPTION

Figure 1:
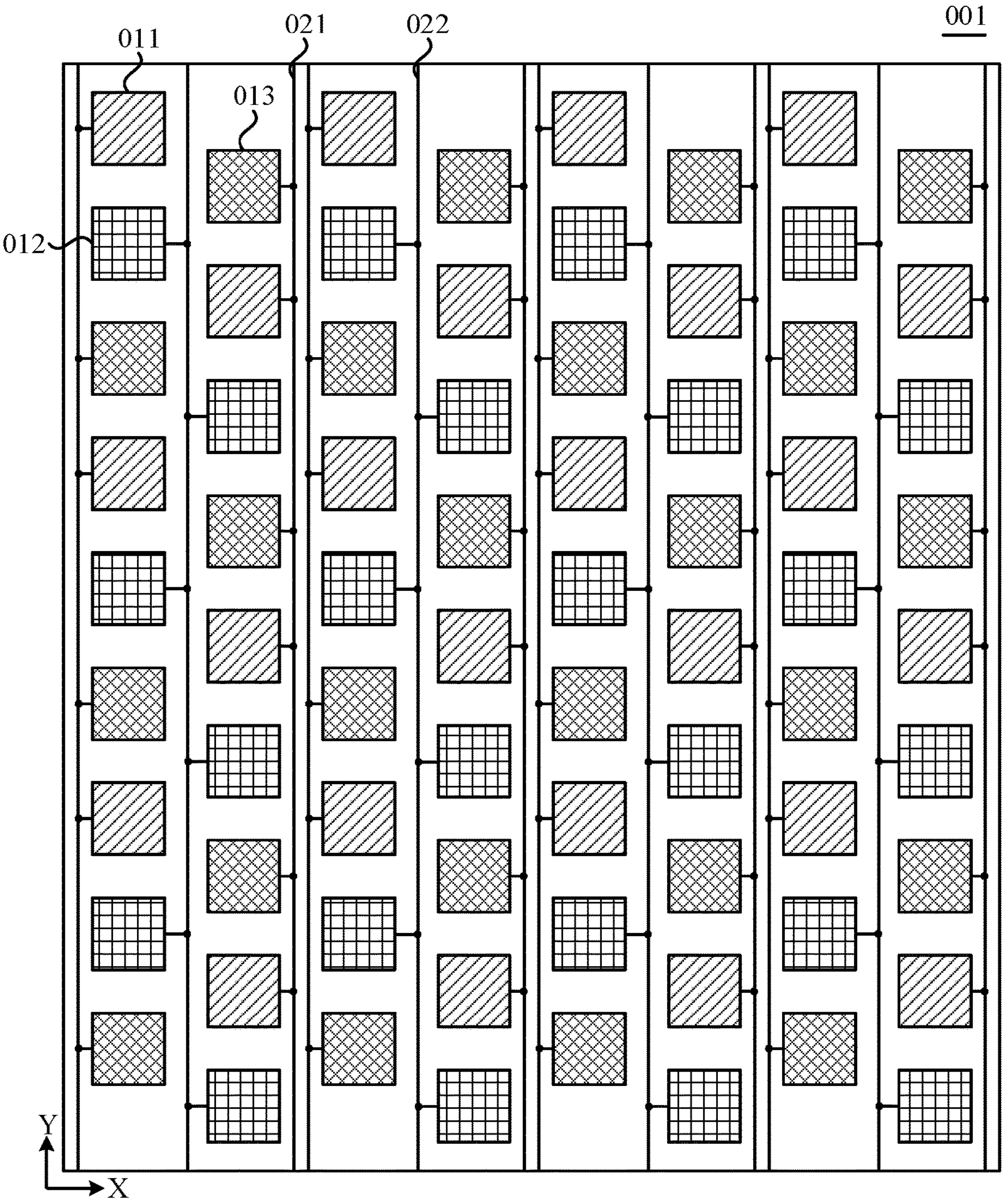
FIG. 1 is a schematic structural view of a display panel in the related art.

The present disclosure will be further described in detail below in conjunction with the drawings and embodiments. It is to be understood that the embodiments described herein are merely intended to illustrate the present disclosure and are not intended to limit the present disclosure. It should also be noted that, for ease of description, only part, but not all, of the structures related to the present disclosure are shown in the drawings.

FIG. 1 is a schematic structural view of a display panel in the related art. As shown in FIG. 1, for a case where sub-pixels (sub-pixels 011, 012 and 013) of a display panel 001 in the related art are arranged in a "YYG" arrangement manner, red sub-pixels 011 and blue sub-pixels 013 disposed in a same column share one data signal line 021, and green sub-pixels 012 in two adjacent columns share one data signal line 022, such that data signals transmitted by the data signal line 021 can be transmitted to the red sub-pixels 011 and the blue sub-pixels 013 in a time-division manner, to control the red sub-pixels and the blue sub-pixels to emit light; and data signals transmitted by the data signal line 022 can be transmitted to the green sub-pixels 012 in the time-division manner, to control the green sub-pixels 012 to emit light.

However, since a luminous efficiency of a light emitting material of the blue sub-pixel 013 is lower than a luminous efficiency of a light emitting material of the red sub-pixel 011 and a luminous efficiency of a light emitting material of the green sub-pixel 012, when the red sub-pixel 011 and the blue sub-pixel 013 share one data signal line 021, if the red sub-pixel 011 needs to have the same light emitting luminance as the blue sub-pixel 013, the voltages of data signals transmitted by the data signal line 021 need to jump continuously to satisfy light emitting requirements of the red sub-pixel 011 and the blue sub-pixel 013 simultaneously.

Therefore, the data signals transmitted by the data signal line 021 have a loss, and thus the accuracy of the data signals transmitted to the red sub-pixels 011 and the blue sub-pixels 013 is affected and the display effect of the display panel is further affected. Particularly, when the display panel 001 is an organic light emitting display panel, an aging test needs to be performed on the display panel 001 before the display panel 001 leaves a factory, and during the aging test, each sub-pixel is generally controlled to present a high and same luminance level, such that decay rates of sub-pixels of different colors are kept consistent while rapid decay stages of the light emitting materials are filtered out. However, when the data signal line 021 cannot accurately transmit data to sub-pixels in order, the decay of each sub-pixel is affected, such that in a subsequent display stage, the uniformity of the light emitting luminance of the display panel 001 is affected and thus the display effect of the display panel 001 is affected.

An embodiment of the present disclosure provides a display panel. The display panel includes multiple sub-pixels and multiple data signal lines. The multiple sub-pixels constitute multiple sub-pixel columns; each sub-pixel column includes multiple sub-pixels arranged in sequence; every three or four adjacent sub-pixels form a pixel unit; and colors of sub-pixels in each pixel unit include red, green and blue. At least part of sub-pixels belonging to a same sub-pixel column share one data signal line, and sub-pixels sharing one data signal line receive data signals transmitted by the one data signal line in the time-division manner. A data signal line electrically connected to red sub-pixels is different from a data signal line electrically connected to blue sub-pixels, and a data signal line electrically connected to green sub-pixels is different from the signal line electrically connected to the blue sub-pixels.

According to the above technical scheme, the blue sub-pixels, the red sub-pixels and the green sub-pixels do not share one data signal line, so it can prevent the data signals from having a loss due to the voltages of the data signals transmitted by the data signal line jump when the blue sub-pixels and the red sub-pixels and/or the green sub-pixels share the data signal line. Therefore, when the blue sub-pixels, the red sub-pixels and the green sub-pixels do not share the data signal line, the loss of the data signals transmitted by the data signal line can be reduced, and it can be ensured that the data signals transmitted by the data signal line can be accurately transmitted to the sub-pixels, thereby improving the display quality of the display panel. In particular, in a process of the aging test, the blue sub-pixels, the red sub-pixels and the green sub-pixels do not share the data signal line, so it is ensured that data signals on each data signal line are accurately transmitted to the sub-pixels, and thus the sub-pixels can have the same or similar light emitting degree and the same or similar aging degree. In a display stage after the aging test stage of the display panel, the display uniformity of the display panel can be ensured and thus the display effect of the display panel can be improved.

The above is the core idea of the present disclosure, and the technical scheme in the embodiments of the present disclosure will be described clearly and in detail below in connection with the drawings in the embodiments of the present disclosure. Based on the embodiments of the present disclosure, all other embodiments obtained by those of ordinary skill in the art without the exercise of inventive capacity belong to the scope of the embodiments of the present disclosure.

In the embodiment of the present disclosure, three or four adjacent sub-pixels form one pixel unit, and for different arrangement manners, three adjacent sub-pixels forming one pixel unit and four adjacent sub-pixels forming one pixel unit are respectively exemplarily illustrated below.

Figure 2:
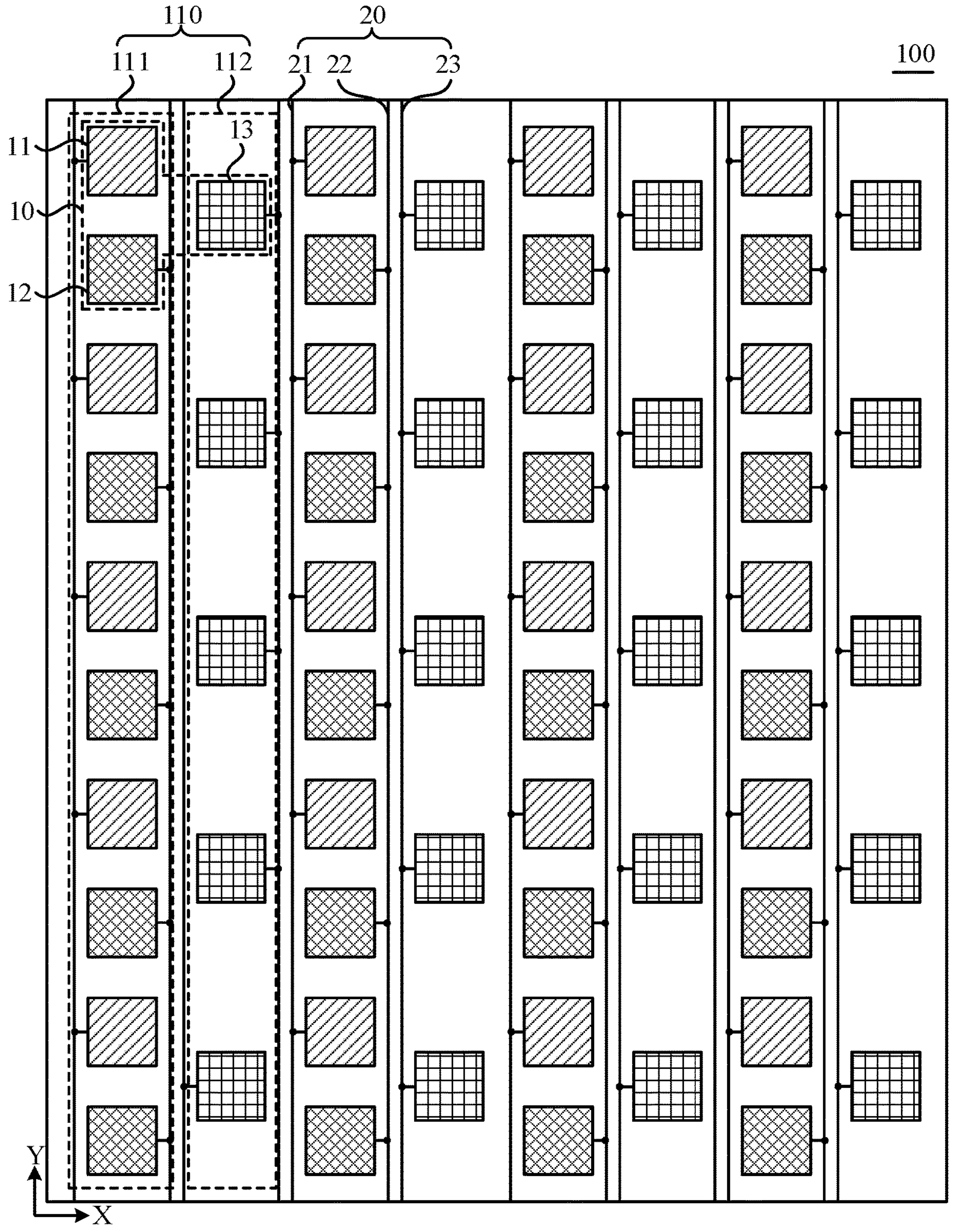
FIG. 2 is a schematic structural view of a display panel according to an embodiment of the present disclosure.

FIG. 2 is a schematic structural view of a display panel according to an embodiment of the present disclosure. As shown in FIG. 2, the display panel includes multiple sub-pixels and multiple data signal lines 20; the multiple sub-pixels constitute multiple sub-pixel columns 110; each sub-pixel column 110 includes multiple sub-pixels arranged in sequence; three or four adjacent sub-pixels form a pixel unit 10. For example, the adjacent sub-pixel 11, sub-pixel 12 and sub-pixel 13 form a pixel unit 110. Colors of sub-pixels in each pixel unit 10 include red, green and blue, such that each pixel unit 10 may present corresponding colors and luminance by light emitting luminance levels of sub-pixels of different colors in the pixel unit 10. The light emitting luminance of each sub-pixel is controlled by a data signal that the each sub-pixel receives, and the data signal is transmitted by the data signal line 20.

Generally, a luminous efficiency of a light emitting material in the blue sub-pixel is relatively low, when the blue sub-pixel has the same light emitting luminance as the red sub-pixel and the green sub-pixel, the blue sub-pixel needs a larger light emitting current, while the red sub-pixel and the green sub-pixel each need a smaller light emitting current, such that the voltage of a data signal provided for the blue sub-pixel is quite different from the voltage of a data signal provided for the red sub-pixel and the voltage of a data signal provided for the green sub-pixel.

With continued reference to FIG. 2, at least part of sub-pixels belonging to a same sub-pixel column 110 share the data signal line 20, and sub-pixels sharing the data signal line 20 receive data signals transmitted by the data signal line 20 in a time-division manner. A data signal line electrically connected to red sub-pixels is different from a data signal line electrically connected to blue sub-pixels, and a data signal line electrically connected to green sub-pixels is different from the data signal line electrically connected to the blue sub-pixels. In this case, the blue sub-pixels, the red sub-pixels and the green sub-pixels do not share the data signal line, so it can be ensured that the voltages of the data signals transmitted by each data signal line do not jump greatly, and the accuracy of the data signals transmitted by each data signal line is improved, and thus the display effect of the display panel is improved. Meanwhile, in a process of the aging test, the blue sub-pixels, the red sub-pixels and the green sub-pixels do not share the data signal line, so it can be ensured that data signals on each data signal line can be accurately transmitted to the sub-pixels. Therefore, the sub-pixels may have the same or similar light emitting degree and thus have the same or similar aging degree, and in a display stage after the aging test stage of the display panel, the display uniformity of the display panel can be ensured and the display effect of the display panel can be improved.

Exemplarily, when three adjacent sub-pixels 11, 12 and 13 form the pixel unit 10, sub-pixels in a same pixel unit 10 are disposed in two adjacent sub-pixel columns 111 and 112, respectively, and two sub-pixels (the sub-pixels 11 and 12) of different colors in a same pixel unit 10 belong to a same sub-pixel column 111, the other sub-pixel (the sub-pixel 13) may be disposed in one sub-pixel column 112 independently. If the color of the sub-pixel 11 is red, the color of the sub-pixel 12 is green, and the color of the sub-pixel 13 is blue, then the red sub-pixels 11 belonging to a same sub-pixel column 111 may be electrically connected to a same data signal line 21, and the green sub-pixels 12 belonging to a same column share a same data signal line 22, and the blue sub-pixels 13 belonging to a same sub-pixel column 112 share a same data signal line 23, i.e., the sub-pixels (the sub-pixels 11, 12 and 13) of different colors adopt different data signal lines (the data signal lines 21, 22 and 23), respectively, such that each data signal line (the data signal line 21, 22 or 23) transmits only data signals for controlling the sub-pixels (the sub-pixels 11, the sub-pixels 12 or the sub-pixels 13) of a same color to emit light.

In this case, each data signal line transmits data signals of sub-pixels of one color, such that the voltages of the data signals transmitted by each data signal line only has relatively small jump or no jump, thereby ensuring the accuracy of the data signals transmitted to sub-pixels electrically connected to a same data signal line, and improving the display effect of the display panel. Meanwhile, in the process of the aging test, the voltages of the data signals transmitted by each data signal line remain unchanged, and the loss of the data signals transmitted from the data signal line to the sub-pixels is reduced, such that the sub-pixels may have the same or similar light emitting degree and thus have the same or similar aging degree. Therefore, in the display stage after the aging test stage of the display panel, the display uniformity of the display panel can be ensured and the display effect of the display panel can be improved.

It should be noted that the foregoing is illustrated by using an example in which colors of two sub-pixels which belong to a same pixel unit 10 and are disposed in a same sub-pixel column 111 are red and blue, respectively. In the embodiment of the present disclosure, colors of two sub-pixels which belong to a same pixel unit 10 and are disposed in a same sub-pixel column 111 may be red and green, respectively, or colors of two sub-pixels which belong to a same pixel unit 10 and are disposed in a same sub-pixel column 111 may be blue and green, respectively, which are not limited in the embodiment of the present disclosure.

Figure 3:
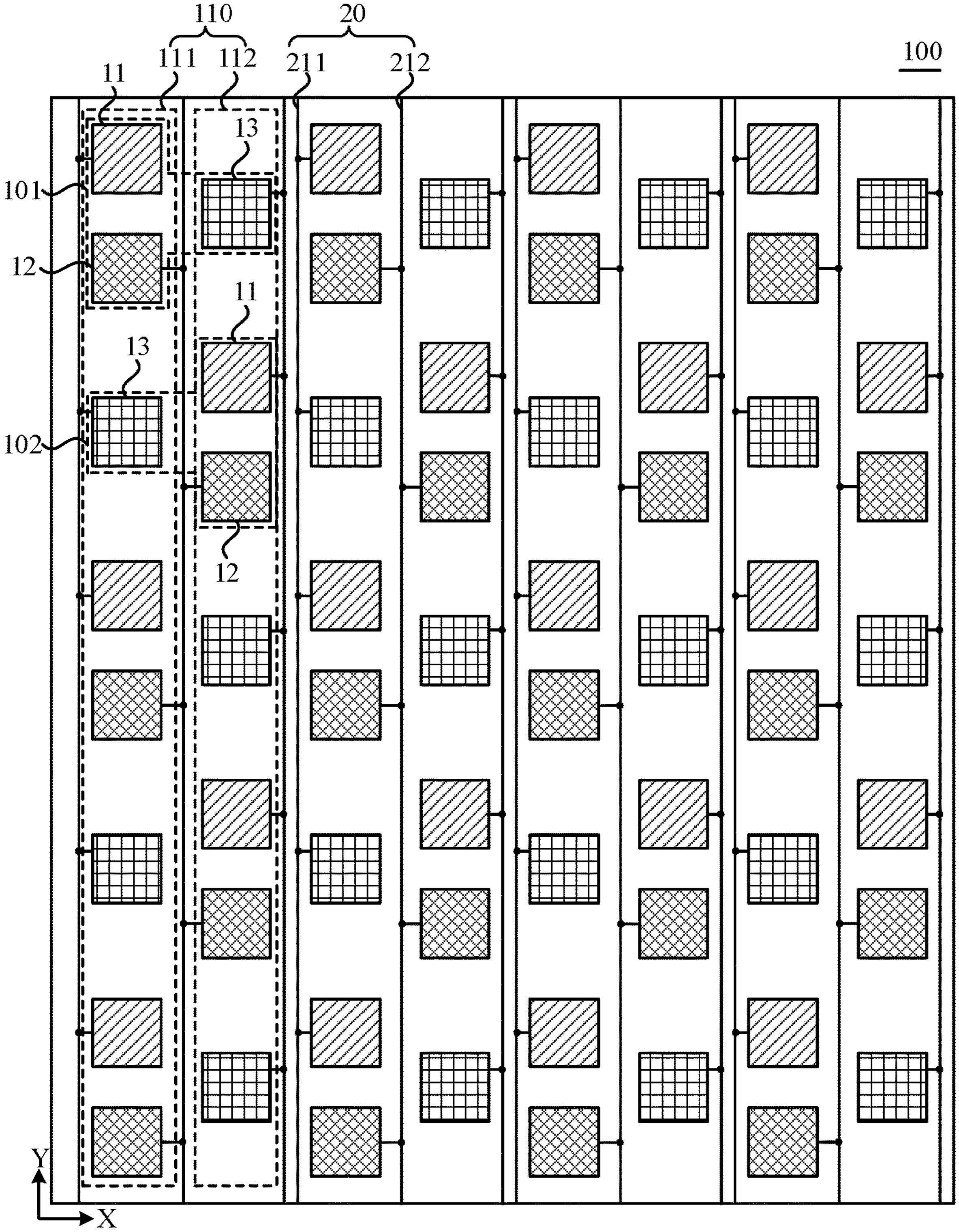
FIG. 3 is a schematic structural view of another display panel according to an embodiment of the present disclosure.

In an embodiment, FIG. 3 is a schematic structural view of another display panel according to an embodiment of the present disclosure. As shown in FIG. 3, when three adjacent sub-pixels in the display panel 100 form a pixel unit, and three sub-pixels in a same pixel unit are a first sub-pixel 11, a second sub-pixel 12 and a third sub-pixel 13, respectively, the color of the first sub-pixel 11 is one of red, green or blue, the color of the second sub-pixel 12 is one of red, green or blue, and the color of the third sub-pixel 13 is one of red, green or blue; and the color of the first sub-pixel 11, the color of the second sub-pixel 12 and the color of the third sub-pixel 13 are different from each other. Two adjacent pixel units disposed in a same column are a first pixel unit 101 and a second pixel unit 102, respectively. The first sub-pixel 11 in the first pixel unit 101, the second sub-pixel 12 in the first pixel unit 101 and the third sub-pixel 13 in the second pixel unit 102 belong to a same sub-pixel column 111, and the third sub-pixel 13 in the first pixel unit 101, the first sub-pixel 11 in the second pixel unit 102 and the second sub-pixel 12 in the second pixel unit 102 belong to a same sub-pixel column 112. In each sub-pixel column, red sub-pixels and green sub-pixels share one data signal line 211; and blue sub-pixels belonging to a same sub-pixel column share one data signal line 212.

Exemplarily, an example in which the color of the first sub-pixel 11 is red, the color of the second sub-pixel 12 is blue, and the color of the third sub-pixel 13 is green is used.

In this case, each sub-pixel column 110 may include three sub-pixels of different colors, thereby preventing that since a column of sub-pixels on the edge are monochromatic sub-pixels, the color of the monochromatic sub-pixels is displayed on the edge position when a corresponding picture is displayed by the display panel, especially when a white picture is displayed. Thus, the display effect of the display panel can be improved. Meanwhile, the luminous efficiency of the light emitting material in the red sub-pixel 11 is similar to the luminous efficiency of the light emitting material in the green sub-pixel 13, such that when the red sub-pixel 11 and the green sub-pixel 13 have the same light emitting luminance, the voltage of the data signal provided for the red sub-pixel 11 is close to the voltage of the data signal provided for the green sub-pixel 13. When the red sub-pixel 11 and the green sub-pixel 13 belonging to a same sub-pixel column 110 share the data signal line 211, the voltage of a data signal transmitted by the data signal line 211 to each red sub-pixel 11 and the voltage of a data signal transmitted to each green sub-pixel 13 in the time-division manner do not jump greatly. Therefore, on the premise of ensuring the accuracy of the data signals transmitted by the data signal line 211, the number of the data signal lines 20 arranged in the display panel 100 can be reduced, and thus an aperture ratio of the display panel 100 can be improved.

In an embodiment, with continued reference to FIG. 3, in two adjacent sub-pixel columns, blue sub-pixels 12 share one data signal line 212, i.e., blue sub-pixels 12 belonging to the sub-pixel column 111 and blue sub-pixels 12 belonging to the sub-pixel column 112 share the data signal line 212. Therefore, the number of the data signal lines 20 arranged in the display panel 100 can be further reduced, and thus the aperture ratio of the display panel 100 can be further improved.

It should be noted that FIG. 3 is an exemplary view of an embodiment of the present disclosure, and FIG. 3 exemplarily shows that the red sub-pixel and the blue sub-pixel in the first pixel unit 101 belong to a same sub-pixel column 111 as the green sub-pixel in the second pixel unit 102, and that the red sub-pixel and the blue sub-pixel in the second pixel unit 102 belong to a same sub-pixel column 112 as the green sub-pixel in the first pixel unit 101. In the embodiments of the present disclosure, sub-pixels belonging to a same sub-pixel column may also be a combination in other forms.

Figure 4:
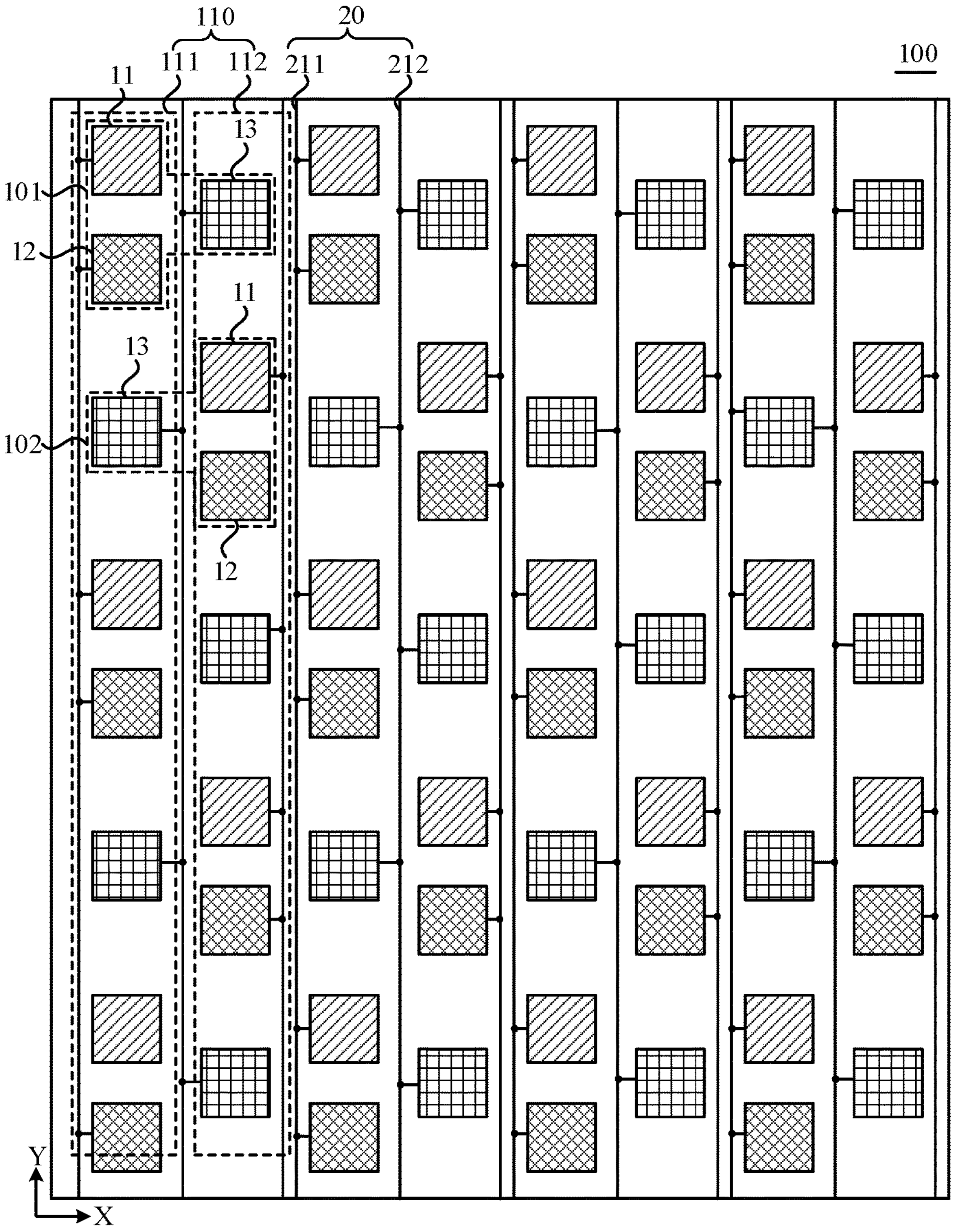
FIG. 4 is a schematic structural view of another display panel according to an embodiment of the present disclosure.

Exemplarily, FIG. 4 is a schematic structural view of another display panel according to an embodiment of the present disclosure. The same in FIG. 4 as in FIG. 3 may be referred to the above description of FIG. 3, and only differences in FIG. 4 from FIG. 3 are exemplarily described here. As shown in FIG. 4, the color of the first sub-pixel 11 may be red, the color of the second sub-pixel 12 may be green, and the color of the third sub-pixel 13 may be blue. In this case, the red sub-pixel 11 in the first pixel unit 101, the green sub-pixel 12 in the first pixel unit 101, and the blue sub-pixel 13 in the second pixel unit 102 belong to a same sub-pixel column 111, and the blue sub-pixel 13 in the first pixel unit 101, the red sub-pixel 11 in the second pixel unit 102, and the green sub-pixel 12 in the second pixel unit 102 belong to a same sub-pixel column 112. In this case, the red sub-pixels 11 and the green sub-pixels 12 disposed in a same column may share one data signal line 211, and the blue sub-pixels 13 belonging to adjacent sub-pixel columns 111 and 112 may share the data signal line 212. Therefore, the number of the data signal lines 20 arranged in the display panel 100 can be reduced, and thus the aperture ratio of the display panel 100 can be improved.

Moreover, in order to enable data signals transmitted by each data signal line to be transmitted to the sub-pixels sharing one data signal line in the time-division manner, multiple scan signal lines may be further arranged in the display panel. When the scan signal line transmits enable signals of scan signals, sub-pixels electrically connected to this scan signal line may receive data signals transmitted by the corresponding data signal line. Therefore, in order to enable data signals to be transmitted to the sub-pixels in a one-to-one correspondence manner, the sub-pixels sharing the data signal line cannot share the scan signal line.

Figure 5:
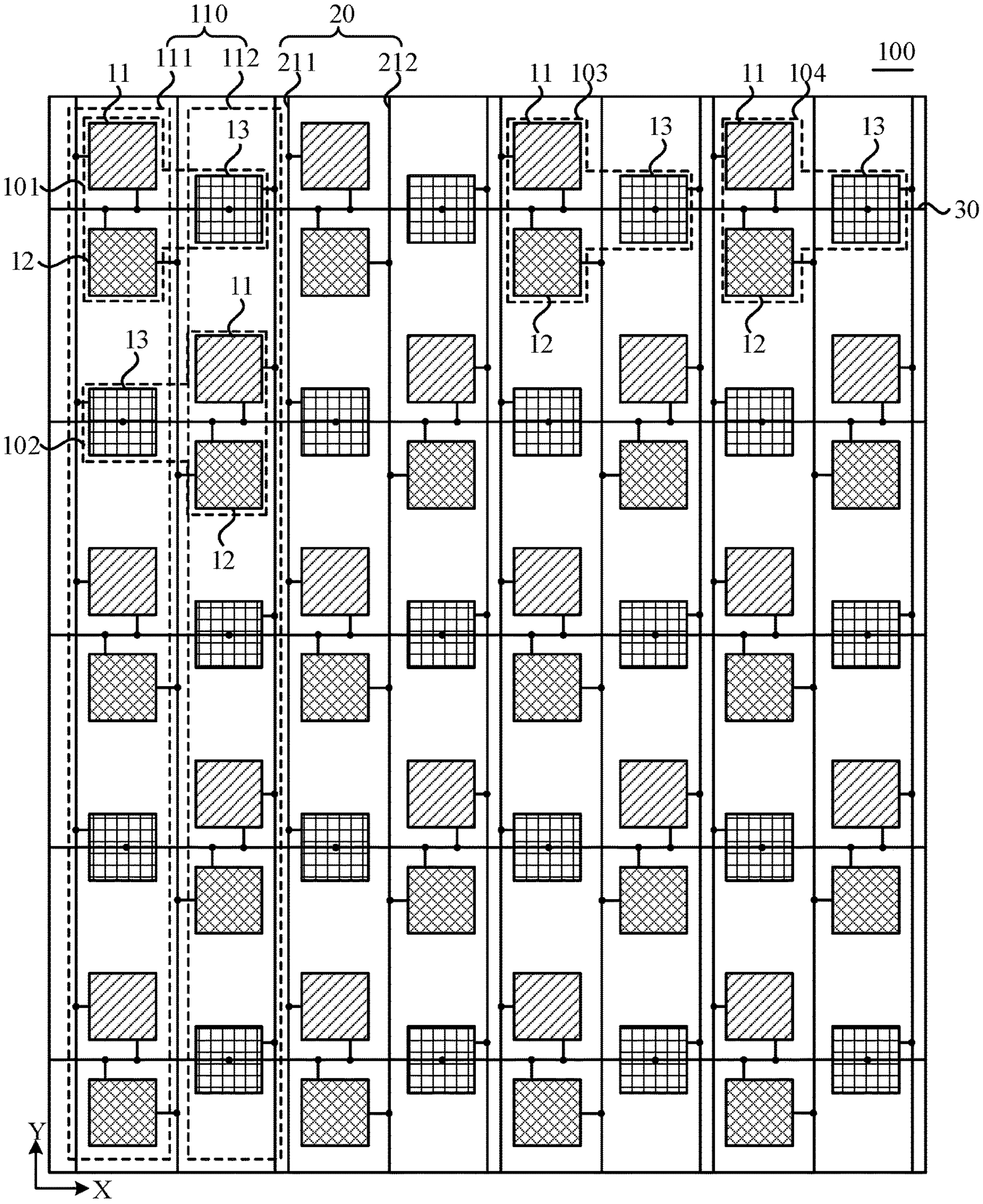
FIG. 5 is a schematic structural view of another display panel according to an embodiment of the present disclosure.

In an embodiment, FIG. 5 is a schematic structural view of another display panel according to an embodiment of the present disclosure. As shown in FIG. 5, the display panel 100 further includes multiple scan signal lines 30, and when an arrangement manner of sub-pixels (the sub-pixels 11, 12 and 13) in each of pixel units (the pixel units 103 and 104) disposed in a same row is the same, that is, relative positions of the sub-pixels (the sub-pixels 11, 12 and 13) in the pixel unit 103 are the same as relative positions of the sub-pixels (the sub-pixels 11, 12 and 13) in the pixel unit 104, the sub-pixels in each of the pixel units (the pixel units 103 and 104) disposed in a same row may share a scan signal line 30.

Exemplarily, when red sub-pixels and green sub-pixels share one data signal line, and blue sub-pixels belonging to a same sub-pixel column share one data signal line, the red sub-pixel and the green sub-pixel in each pixel unit (the pixel unit 101, 102, 103 or 104) cannot be disposed in a same column. In this case, the color of one sub-pixel of the first sub-pixel 11 or the second sub-pixel 12 in a same pixel unit should be blue, and the color of the other sub-pixel may be red or green. An example in which the color of the first sub-pixel 11 is red, the color of the second sub-pixel 12 is blue, and the color of the third sub-pixel 13 is green is used, the red sub-pixel 11 and the green sub-pixel 13 in a same pixel unit (the pixel unit 101, 102, 103 or 104) are disposed in different columns, such that these sub-pixels do not share the data signal line 20, and the sub-pixels (the sub-pixels 11, 12 and 13) in each of the pixel units (the pixel units 103 and 104) disposed in a same row do not share the data signal line. Therefore, when the sub-pixels (the sub-pixels 11, 12 and 13) in each of the pixel units (the pixel units 103 and 104) disposed in a same row share the scan signal line 30, data signals on each data signal line 20 may be transmitted to the sub-pixels (the sub-pixels 11, 12 and 13) in each of the pixel units (the pixel units 103 and 104) disposed in a same row in a one-to-to-one correspondence manner, such that each sub-pixel (the sub-pixel 11, 12 or 13) may display and emit light according to the data that the each sub-pixel receives.

In an embodiment, with continued reference to FIG. 5, in a same pixel unit 101, an orthographic projection of the first sub-pixel 11 in a direction perpendicular to a column direction Y and an orthographic projection of the second sub-pixel 12 in the direction perpendicular to the column direction Y each have an overlap with an orthographic projection of the third sub-pixel 13 in the direction perpendicular to the column direction Y. In this case, light emitted by the first sub-pixels 11 disposed in a first row may be mixed with light emitted by the third sub-pixels 13 and light emitted by the second sub-pixels 12 disposed in a tail row may be mixed with light emitted by the third sub-pixels 13, thereby preventing that since a row of sub-pixels on the edge are monochromatic sub-pixels, the color of the monochromatic sub-pixels is displayed on the edge position when a corresponding picture is displayed by the display panel, especially when a white picture is displayed. Thus, the display effect of the display panel can be improved.

Figure 6:
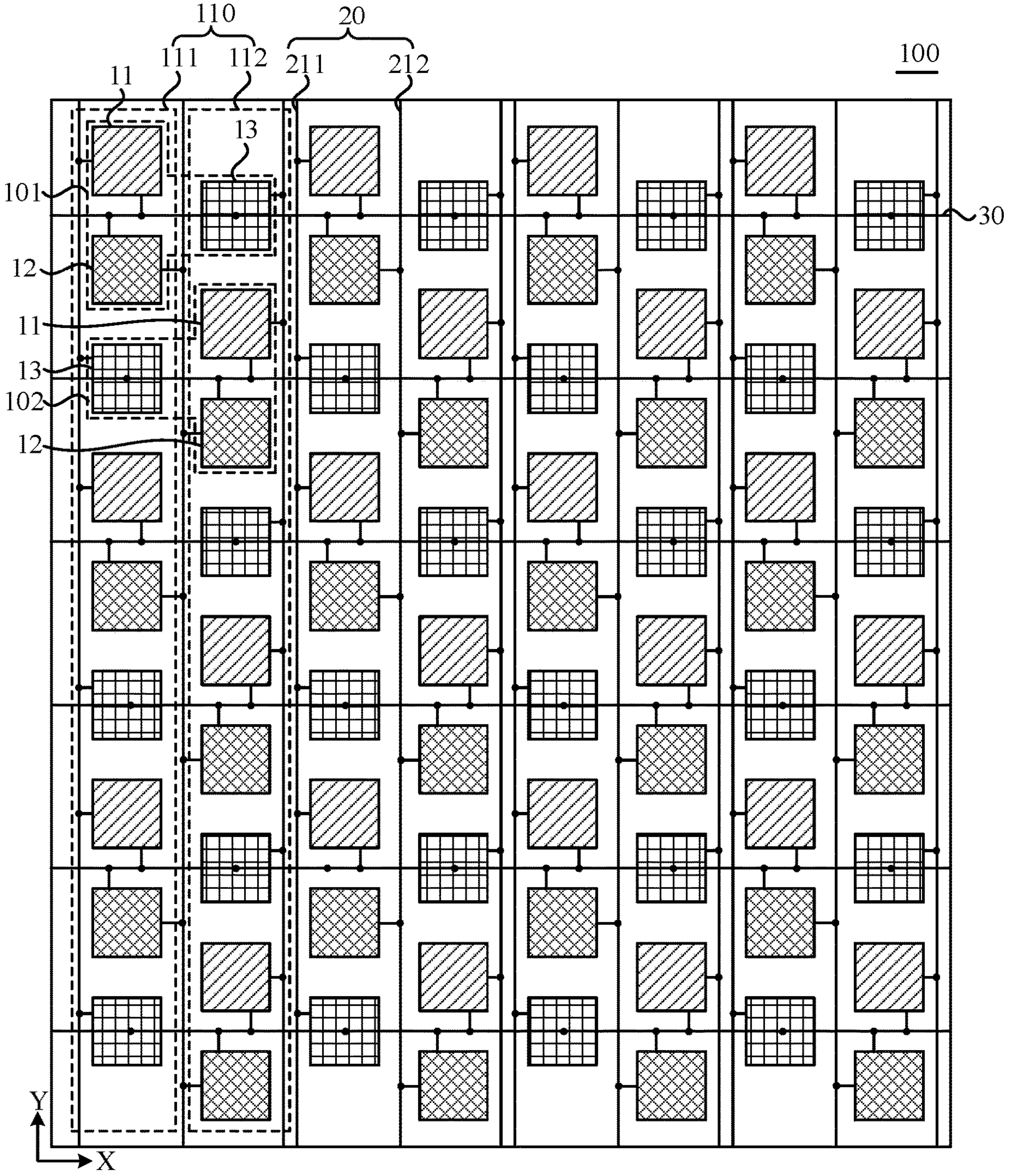
FIG. 6 is a schematic structural view of another display panel according to an embodiment of the present disclosure.

In an embodiment, FIG. 6 is a schematic structural view of another display panel according to an embodiment of the present disclosure. As shown in FIG. 6, an orthographic projection of the second sub-pixel 12 in the first pixel unit 101 in the direction perpendicular to the column direction Y has an overlap with an orthographic projection of the first sub-pixel 11 in the second pixel unit 102 in the direction perpendicular to the column direction Y. In this case, the sub-pixels can be closely arranged, the arrangement density of the sub-pixels in the display panel 100 is improved, and thus the resolution of the display panel 100 is improved.

Meanwhile, when an orthographic projection of the second sub-pixel 12 in the first pixel unit 101 in the direction perpendicular to the column direction Y has an overlap with an orthographic projection of the first sub-pixel 11 in the second pixel unit 102 in the direction perpendicular to the column direction Y, the sub-pixels in the display panel 100 may be arranged in a "YYG" arrangement manner, such that a pixel rendering requirement can be satisfied, and when the display panel 100 performs display, the resolution of a picture displayed by the display panel 100 is further improved.

It should be noted that FIGS. 2 to 6 are only exemplary views of the embodiments of the present disclosure, and FIGS. 2 to 6 only exemplarily show that the shape of each sub-pixel is rectangular, i.e., the shape of the light emitting material in each sub-pixel is rectangular, while the shape of the light emitting material in each sub-pixel in the embodiments of the present disclosure may also be other shapes, such as circle, ellipse, triangle, rounded rectangle, polygon, which are not limited in the embodiments of the present disclosure. For ease of description, the embodiments of the present disclosure are exemplarily described by using an example in which the shape of the light emitting material in each sub-pixel is rectangle.

It may be understood that FIGS. 2 to 6 are only exemplary views of the embodiments of the present disclosure, and FIGS. 2 to 6 only exemplarily show the arrangement of the sub-pixels in a case where three adjacent sub-pixels form a pixel unit, while in the embodiments of the present disclosure, the arrangement of each pixel unit can also be in other forms in a case where three adjacent sub-pixels form a pixel unit.

Figure 7:
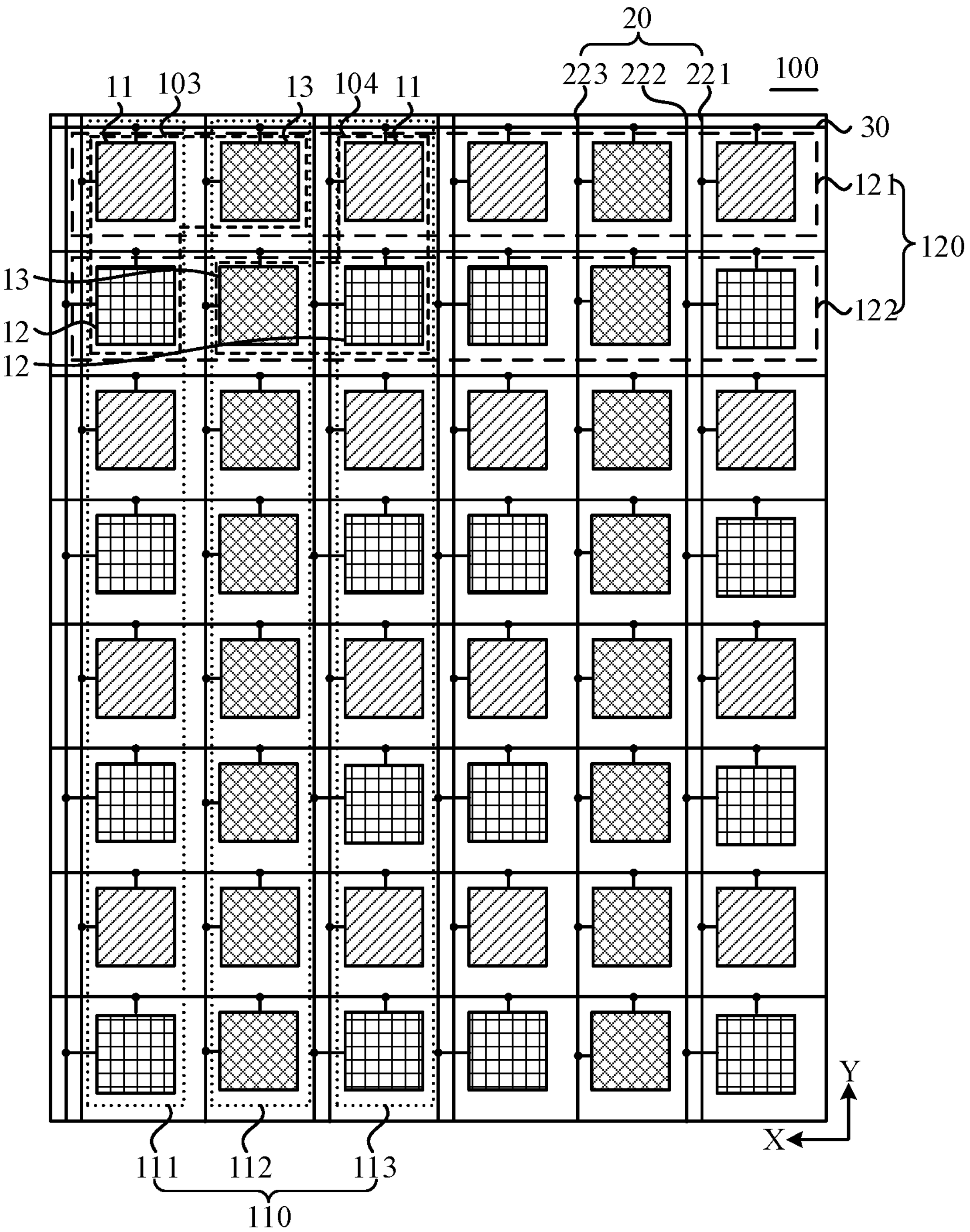
FIG. 7 is a schematic structural view of another display panel according to an embodiment of the present disclosure.

In an embodiment, FIG. 7 is a schematic structural view of another display panel according to an embodiment of the present disclosure. As shown in FIG. 7, multiple sub-pixels further constitute multiple sub-pixel rows; each sub-pixel row includes multiple sub-pixels arranged in sequence; in a case where three adjacent sub-pixels form one pixel unit (the pixel unit 103 or 104), three sub-pixels in a same pixel unit (the pixel unit 103 or 104) are a first sub-pixel 11, a second sub-pixel 12 and a third sub-pixel 13, respectively, and the color of the first sub-pixel 11 is one of red, green or blue, the color of the second sub-pixel 12 is one of red, green or blue, and the color of the third sub-pixel 13 is one of red, green or blue; and the color of the first sub-pixel 11, the color of the second sub-pixel 12 and the color of the third sub-pixel 13 are different from each other. In a same pixel unit, the first sub-pixel 11 and the second sub-pixel 12 belong to a same sub-pixel column (the sub-pixel column 111 or 113), and the third sub-pixel 13 and one of the first sub-pixel 11 or the second sub-pixel 12 belong to a same sub-pixel row 120. Two adjacent pixel units disposed in a same row are a third pixel unit 103 and a fourth pixel unit 104, respectively; and the third sub-pixel 13 in the third pixel unit 103 and the third sub-pixel in the fourth pixel unit 104 belong to a same sub-pixel column 112; where sub-pixels which belong to a same sub-pixel column and have a same color share one data signal line 20.

Exemplarily, an example is used in which the first sub-pixel 11 in the third pixel unit 103, the third sub-pixel 13 in the third pixel unit 103 and the first sub-pixel 11 in the fourth pixel unit 104 belong to a same sub-pixel row 121; the second sub-pixel 12 in the third pixel unit 103, the second sub-pixel 12 in the fourth pixel unit 104 and the third sub-pixel 13 in the fourth pixel unit 104 belong to a same sub-pixel row 122; the first sub-pixel 11 in the third pixel unit 103 and the second sub-pixel 12 in the third pixel unit 103 belong to a same sub-pixel column 111; the third sub-pixel 13 in the third pixel unit 103 and the third sub-pixel 13 in the fourth pixel unit 104 belong to a same sub-pixel column 112; and the first sub-pixel 11 in the fourth pixel unit 104 and the second sub-pixel 12 in the fourth pixel unit 104 belong to a same sub-pixel column 113. In this case, the first sub-pixels 11 belonging to a same sub-pixel column share one data signal line 221, the second sub-pixels 12 belonging to a same sub-pixel column share one data signal line 222, and the third sub-pixels 13 belonging to a same sub-pixel column share one data signal line, namely, under such pixel arrangement manner, sub-pixels of a same color may share one data signal line, and sub-pixels of different colors are electrically connected to different data signal lines.

In this case, each data signal line transmits data signals of sub-pixels of one color, such that the voltages of the data signals transmitted by each data signal line only have relatively small jump or no jump, thereby ensuring the accuracy of data signals transmitted to sub-pixels electrically connected to a same data signal line, and improving the display effect of the display panel. Meanwhile, each data signal line is electrically connected to only sub-pixels of one color belonging to a same sub-pixel column, such that the amount of load on each data signal line can be reduced.

In an embodiment, with continued reference to FIG. 7, since sub-pixels of a same color belonging to a same sub-pixel column share one data signal line 20, when the display panel 100 further includes multiple scan signal lines 30, sub-pixels belonging to a same sub-pixel row 120 may share one scan signal line 30, and when each scan signal line 30 sequentially transmits an enable level of a scan signal, each data signal line 20 may transmit data signals to sub-pixels in a one-to-one correspondence manner and in the time-division manner.

With continued reference to FIG. 7, the colors of the first sub-pixel 11 and the second sub-pixel 12 may be red and blue, respectively, and the color of the third sub-pixel 13 may be green; or, the colors of the first sub-pixel 11 and the second sub-pixel 12 may be red and green, respectively, and the color of the third sub-pixel 13 may be blue; or, the colors of the first sub-pixel 11 and the second sub-pixel 12 may be green and blue, respectively, and the color of the second sub-pixel 12 may be red. The colors of the first sub-pixel 11, the second sub-pixel 12 and the third sub-pixel 13 are not limited in the embodiments of the present disclosure.

Figure 8:
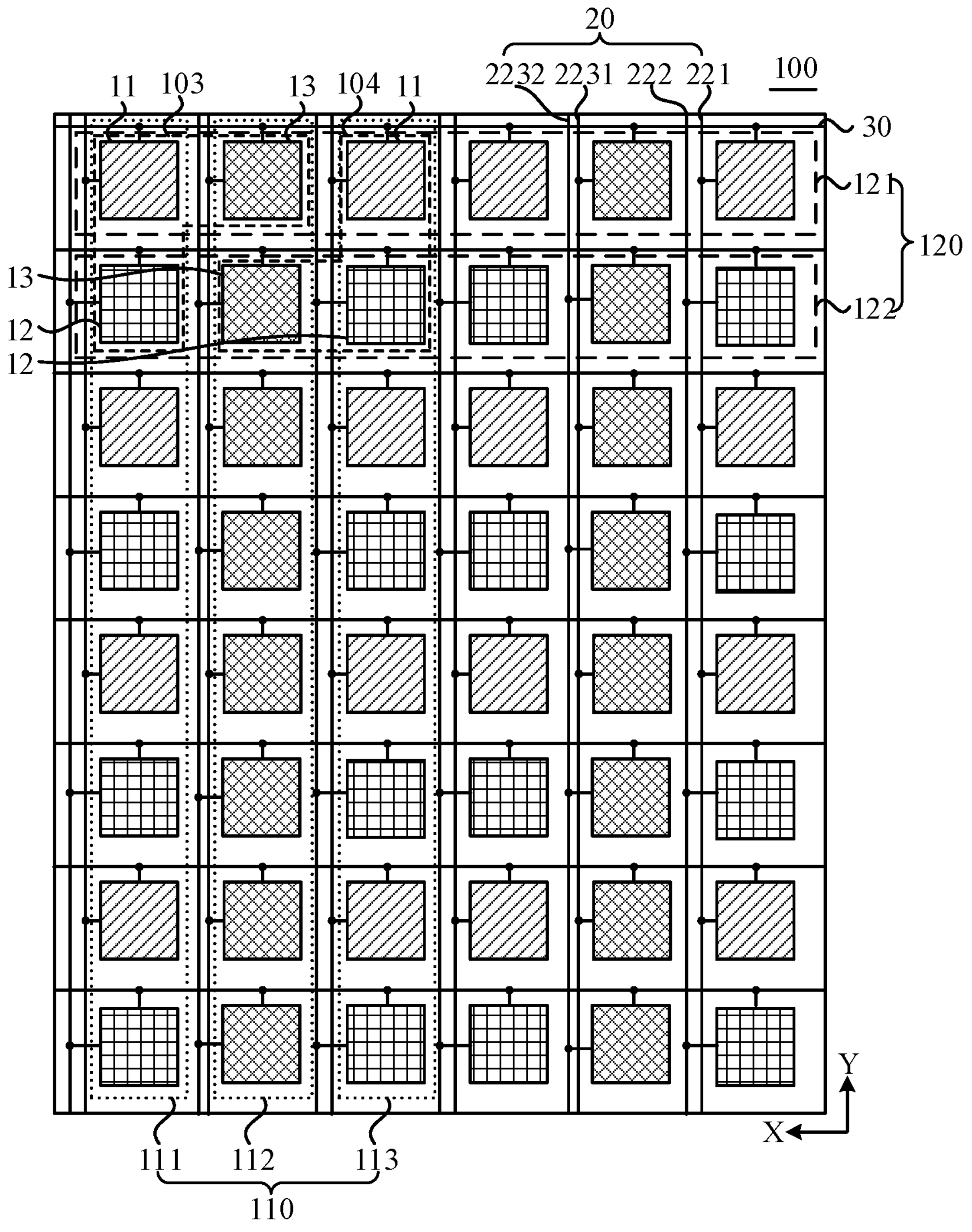
FIG. 8 is a schematic structural view of another display panel according to an embodiment of the present disclosure.

In an embodiment, FIG. 8 is a schematic structural view of another display panel according to an embodiment of the present disclosure. As shown in FIG. 8, in a same pixel unit, the first sub-pixel 11 and the second sub-pixel 12 belong to a same sub-pixel column (the sub-pixel column 111 or 113), and the third sub-pixel 13 and one of the first sub-pixel 11 or the second sub-pixel 12 belong to a same sub-pixel row 120. In addition, when the third sub-pixel 13 in the third pixel unit 103 and the third sub-pixel in the fourth pixel unit 104 belong to a same sub-pixel column 112, a connection relation between each sub-pixel and the data signal line may also be as follows: first sub-pixels 11 belonging to a same sub-pixel column share one data signal line 221, and second sub-pixels 12 belonging to a same sub-pixel column share one data signal line 222, and any two adjacent third sub-pixels 13 belonging to a same sub-pixel column are electrically connected to two different data signal lines 2231 and 2232, respectively. For example, among third sub-pixels 13 belonging to a same sub-pixel column, third sub-pixels 13 disposed in odd-numbered rows share one data signal line 2231, and third sub-pixels 13 disposed in even-numbered rows share one data signal line 2232. In this case, the number of the third sub-pixels 13 to which the data signal lines 2231 and 2232 are electrically connected can be reduced, and the amount of load on the data signal line electrically connected to the third sub-pixels 13 can be further reduced.

Figure 9:
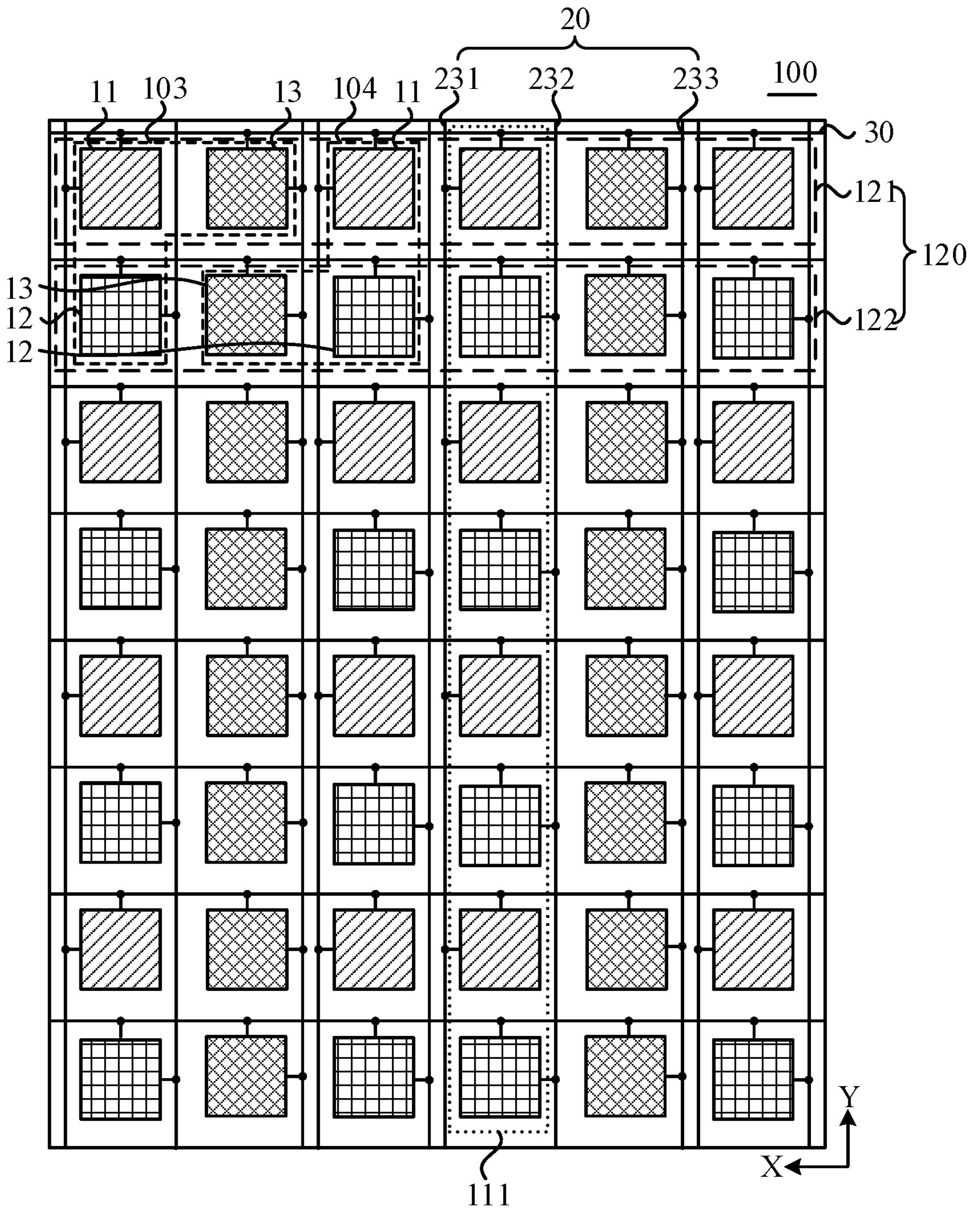
FIG. 9 is a schematic structural view of another display panel according to an embodiment of the present disclosure.

In an embodiment, FIG. 9 is a schematic structural view of another display panel according to an embodiment of the present disclosure. As shown in FIG. 9, multiple sub-pixel columns include first sub-pixel columns 111, and the first sub-pixel column 111 includes first sub-pixels 11 and second sub-pixels 12 alternately arranged in sequence. Two data signal lines 231 and 232 disposed on two opposite sides of the first sub-pixel column 111 are electrically connected to the first sub-pixels 11 and the second sub-pixels 12 in the first sub-pixel column 111, respectively.

Exemplarily, the data signal lines 231 and 232 are disposed on the two opposite sides of the first sub-pixel column 111, respectively, the data signal line 231 may be electrically connected to the first sub-pixels 11 in the first sub-pixel column 111, and the data signal line 232 may be electrically connected to the second sub-pixels 12 in the first sub-pixel column 111, such that the data signal line 231 is configured to transmit data signals of the first sub-pixels 11 in the time-division manner, and the data signal line 232 is configured to transmit data signals of the second sub-pixels 12 in the time-division manner. Thus, on a premise that the data signals may be accurately transmitted to the sub-pixels by each data signal line 20, data signal lines electrically connected to any two sub-pixels (the sub-pixels 11 and 12) belonging to a same first sub-pixel column 111 may be symmetrically distributed on the two opposite sides of the first sub-pixel column 111, such that the design of the display panel can be simplified.

In an embodiment, each sub-pixel includes a pixel circuit; when two data signal lines disposed on the two opposite sides of the first sub-pixel column are electrically connected to the first sub-pixels and the second sub-pixels in the first sub-pixel column, respectively, a pixel circuit of the first sub-pixel and a pixel circuit of the second sub-pixel which belong to a same sub-pixel column and are adjacent to each other are centrally symmetric in structure.

Figure 10:
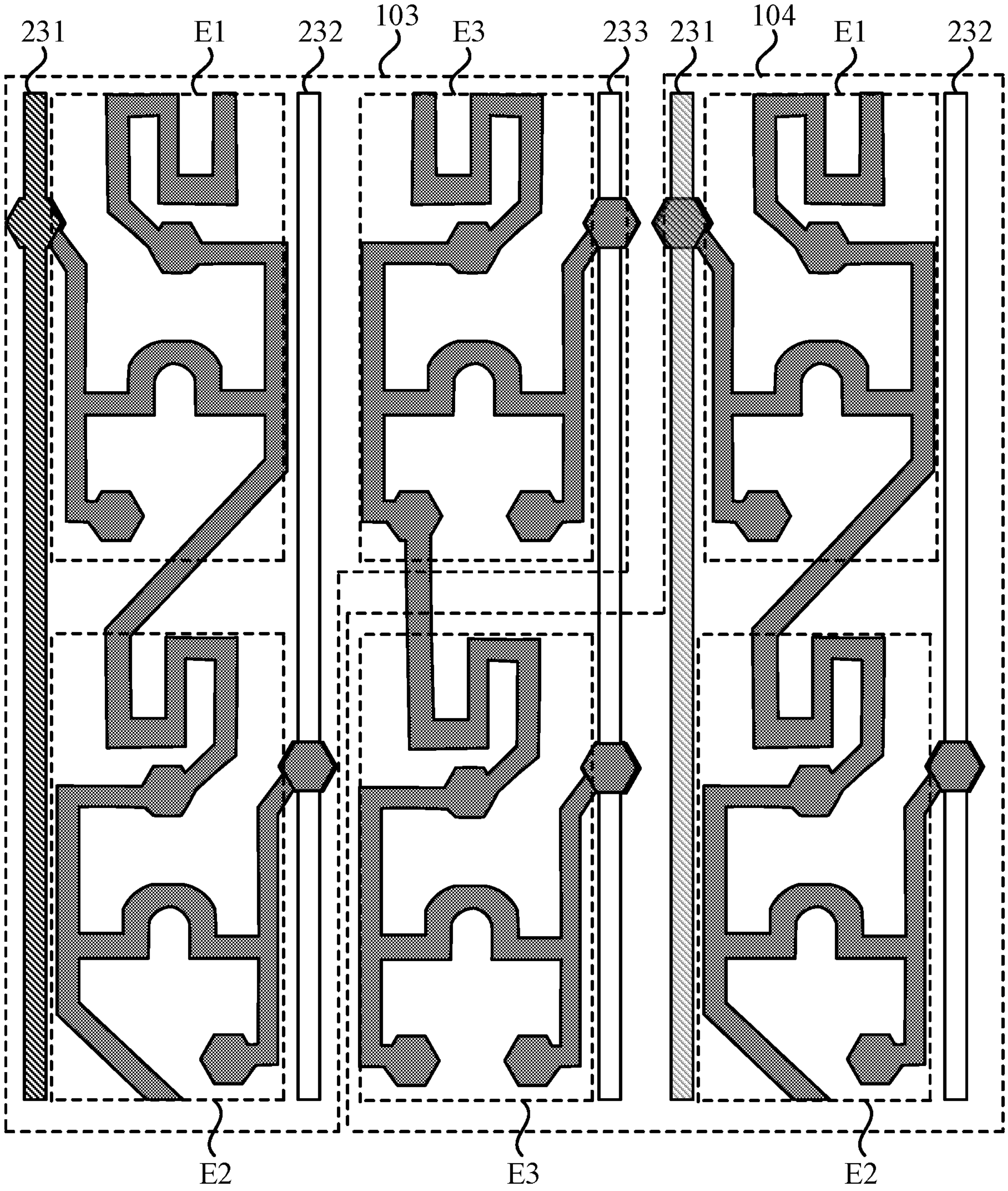
FIG. 10 is a partial schematic structural view of a display panel according to an embodiment of the present disclosure.

Exemplarily, FIG. 10 is a partial schematic structural view of a display panel according to an embodiment of the present disclosure. As shown in FIGS. 9 and 10, the first sub-pixel 11 includes a pixel circuit E1, the second sub-pixel 12 includes a pixel circuit E2, the third sub-pixel 13 includes a pixel circuit E3, and each pixel circuit (the pixel circuit E1, E2 or E3) may include at least one switch transistor electrically connected to a data signal line. When first sub-pixels 11 and second sub-pixels 12 belonging to a same first sub-pixel column 111 are electrically connected to two data signal lines 231 and 232 on the two opposite sides of the first sub-pixel column 111, respectively, and when the pixel circuit E1 of the first sub-pixel 11 and the pixel circuit E2 of the second sub-pixel 12 which belong to a same sub-pixel column 111 and are adjacent to each other are centrally symmetric in structure, a switch transistor in the first sub-pixel 11 and a switch transistor in the second sub-pixel 12 are centrally symmetric in structure, which is conducive to the layout and design of the pixel circuits and to simplifying the structure of the display panel 100.

Accordingly, when third sub-pixels 13 in a same column are electrically connected to a same data signal line 233, the pixel circuits E3 of the third sub-pixels 13 may have a same structure, i.e., switch transistors of the third sub-pixels 13 have a same structure.

In an embodiment, when each sub-pixel includes the pixel circuit and any two adjacent sub-pixels belonging to a same sub-pixel column are electrically connected to two data signal lines disposed on two opposite sides of this sub-pixel column, respectively, pixel circuits of two adjacent third sub-pixels belonging to a same sub-pixel column are centrally symmetric in structure, and a pixel circuit of the first sub-pixel and a pixel circuit of the second sub-pixel which belong to a same sub-pixel column and are adjacent to each other are centrally symmetric in structure.

Figure 11:
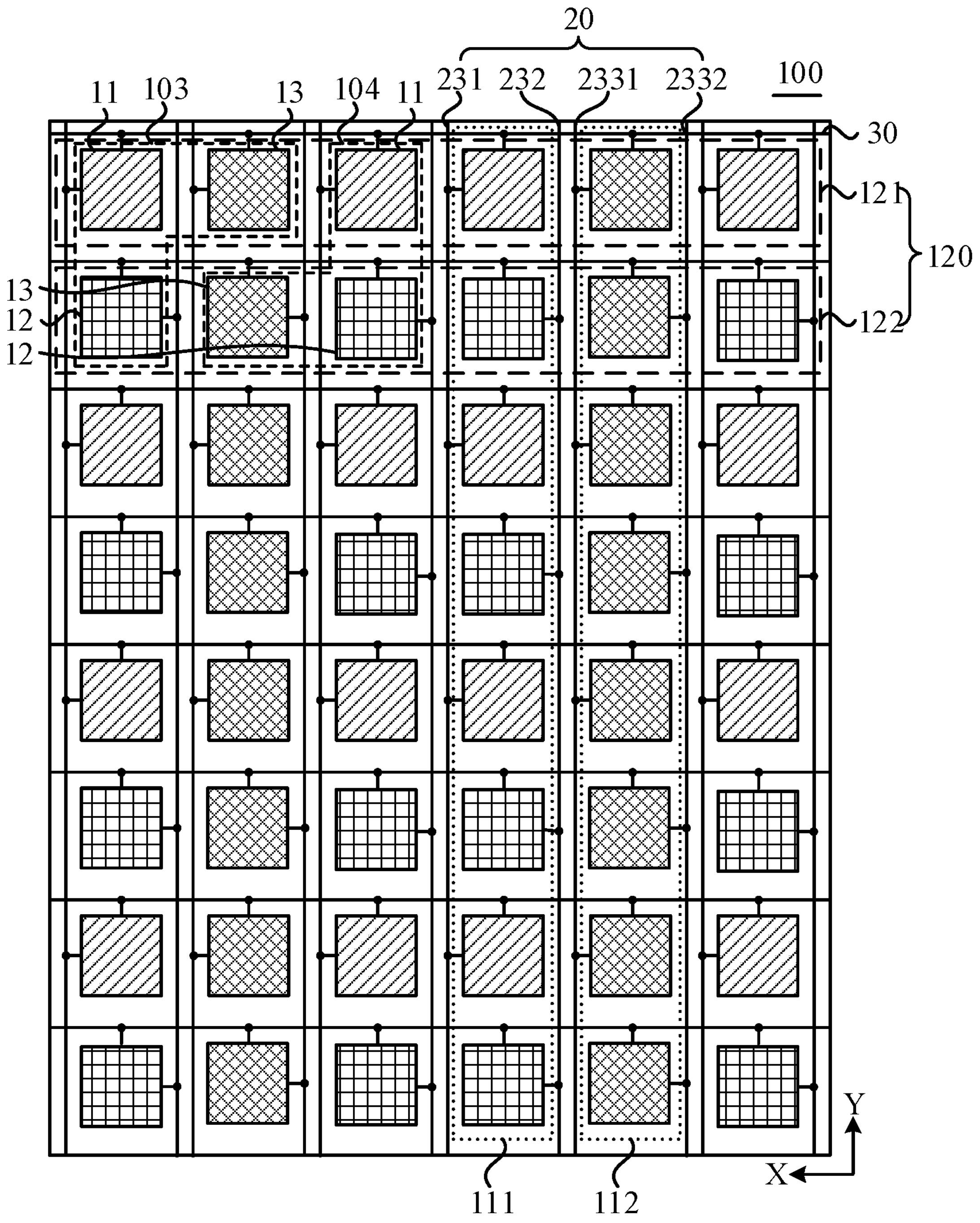
FIG. 11 is a schematic structural view of another display panel according to an embodiment of the present disclosure.
Figure 12:
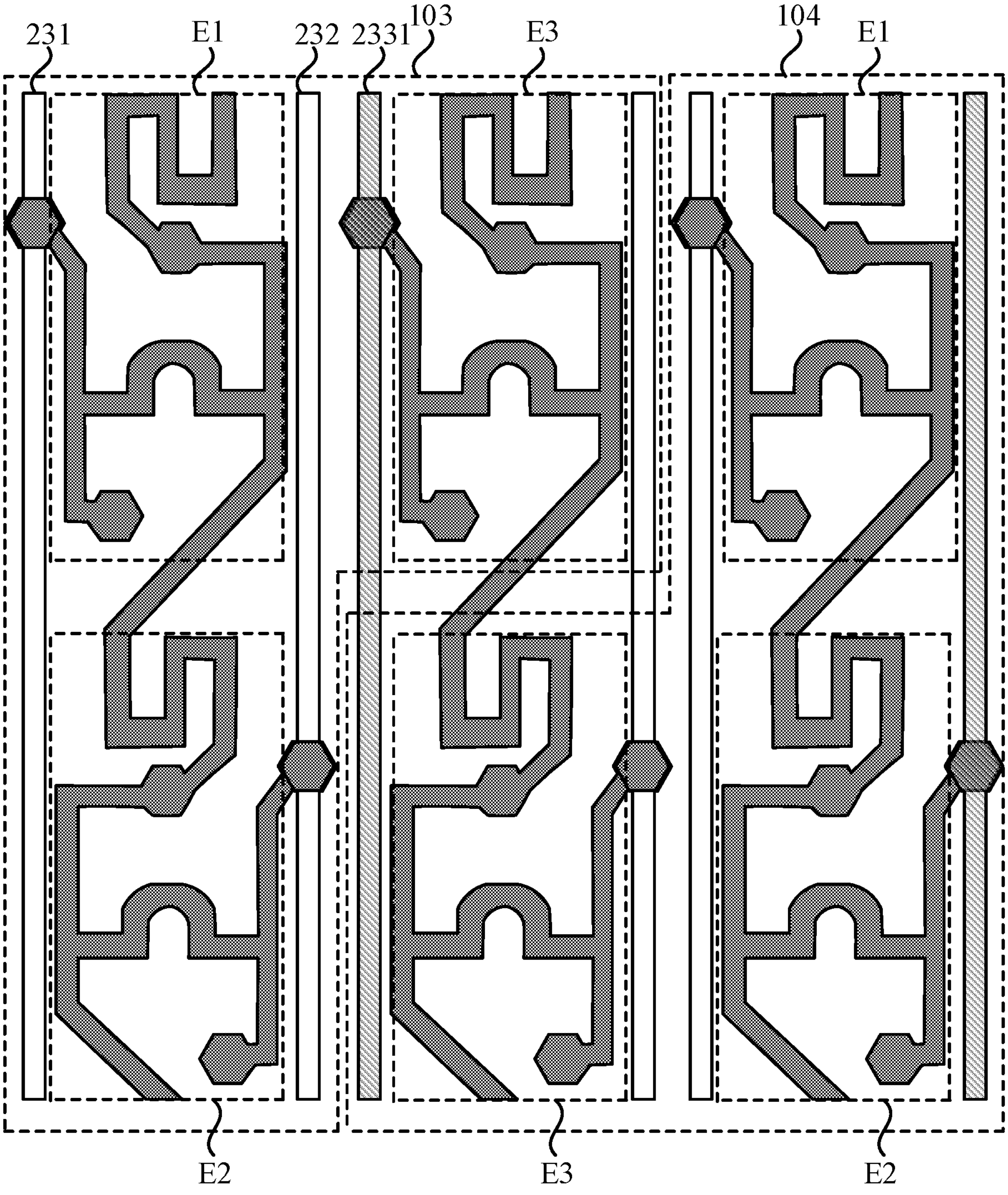
FIG. 12 is a partial schematic structural view of another display panel according to an embodiment of the present disclosure.

Exemplarily, FIG. 11 is a schematic structural view of another display panel according to an embodiment of the present disclosure, and FIG. 12 is a partial schematic structural view of another display panel according to an embodiment of the present disclosure. As shown in FIGS. 11 and 12, first sub-pixels 11 and second sub-pixels 12 belonging to a same sub-pixel column 111 are electrically connected to the data signal line 231 and the data signal line 232 on two opposite sides of the sub-pixel column 111, respectively, and two adjacent third sub-pixels 13 belonging to a same sub-pixel column 112 are electrically connected to the data signal line 2331 and the data signal line 2332 on two opposite sides of the sub-pixel column 112, respectively. In this case, a pixel circuit E1 of the first sub-pixel 11 and a pixel circuit of the second sub-pixel 12 which belong to a same sub-pixel column 111 and are adjacent to each other are centrally symmetric in structure, and pixel circuits E3 of two adjacent third sub-pixels 13 belonging to a same sub-pixel column 112 are centrally symmetric in structure, which is conducive to the layout and design of the pixel circuits and to simplifying the structure of the display panel 100.

It is be understood that in FIGS. 7 to 12, the first sub-pixel 11 in the third pixel unit 103 and the third sub-pixel 13 in the third pixel unit 103 belong to a same sub-pixel row 121, and the second sub-pixel 12 in the fourth pixel unit 104 and the third sub-pixel 13 in the fourth pixel unit 104 belong to a same sub-pixel row 122; while in the embodiments of the present disclosure, it may also be implemented that the second sub-pixel in the third pixel unit and the third sub-pixel in the third pixel unit belong to a same sub-pixel row, the first sub-pixel in the fourth pixel unit and the third sub-pixel in the fourth pixel unit belong to a same sub-pixel row, and the technical principle is similar to that of the cases shown in the FIGS. 7 to 12, which will not be repeated here.

Figure 13:
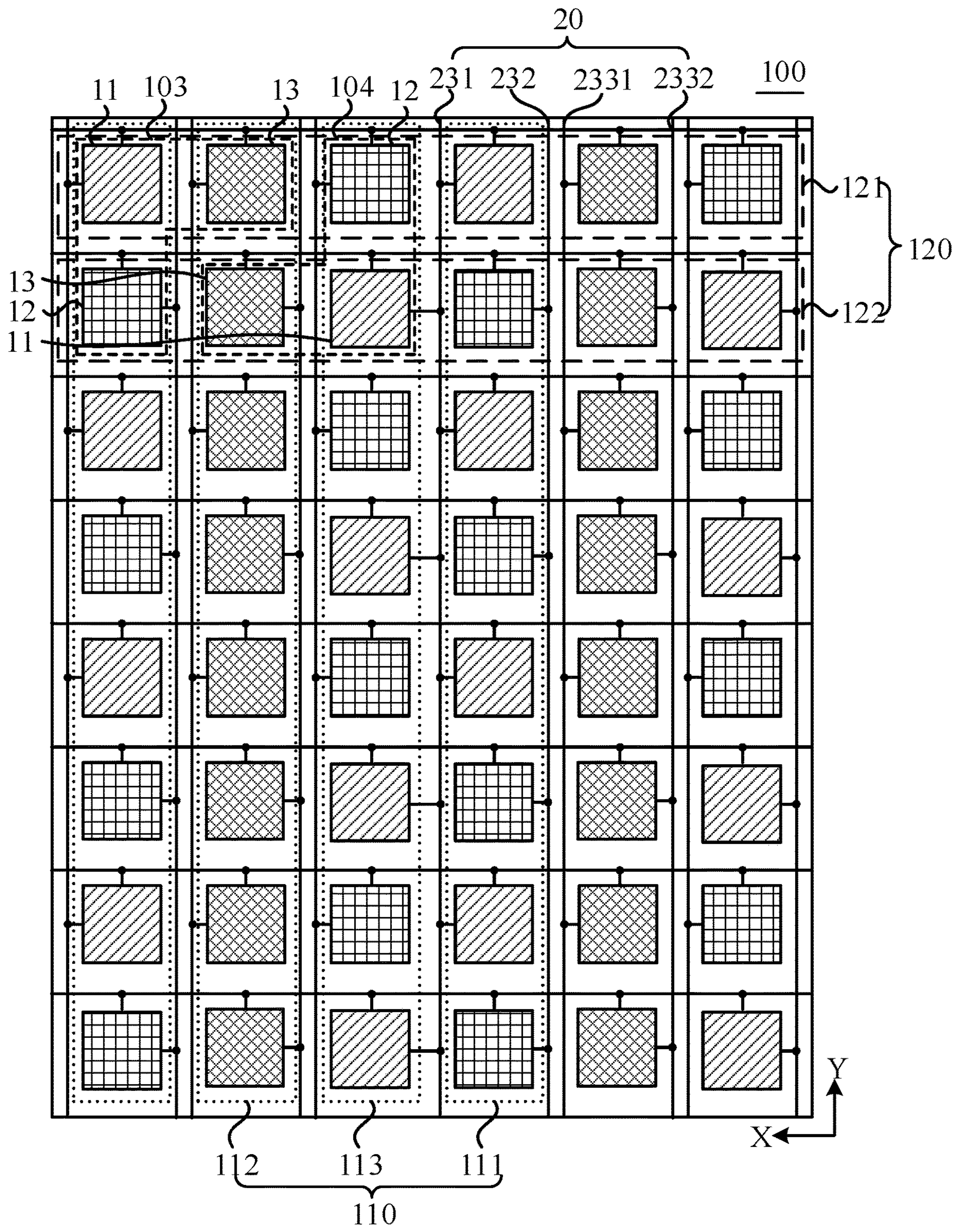
FIG. 13 is a schematic structural view of another display panel according to an embodiment of the present disclosure.

In an embodiment, FIG. 13 is a schematic structural view of another display panel according to an embodiment of the present disclosure. As shown in FIG. 13, the first sub-pixel 11 in the third pixel unit 103 and the second sub-pixel 12 in the fourth pixel unit 104 belong to a same sub-pixel row 121, and the second sub-pixel 12 in the third pixel unit 103 and the first sub-pixel 11 in the fourth pixel unit 104 belong to a same sub-pixel row 122. The color of the first sub-pixel 11 is one of red, green or blue, the color of the second sub-pixel 12 is one of red, green or blue and the color of the third sub-pixel 13 is one of red, green or blue, and the colors of the first sub-pixel 11, the second sub-pixel 12 and the third sub-pixel 13 are different from each other, so that each sub-pixel row may include a red sub-pixel, a green sub-pixel and a blue sub-pixel, which is conducive to improving the display effect of the display panel 100. Meanwhile, when the color of the first sub-pixel 11 is red, the color of the second sub-pixel 12 is blue and the color of the third sub-pixel 13 is green, an arrangement manner of the sub-pixels in the display panel 100 is "RGBBGR". In this case, when the display panel 100 displays a picture, pixel rendering may be performed based on the pixel arrangement manner of "RGBBGR", such that the resolution of the picture displayed by the display panel 100 can be improved.

In an embodiment, multiple sub-pixel columns include first sub-pixel columns, and the first sub-pixel column includes first sub-pixels and second sub-pixels which are alternately arranged in sequence; two data signal lines disposed on two opposite sides of the first sub-pixel column are electrically connected to the first sub-pixels and the second sub-pixels in the first sub-pixel column, respectively; and in two adjacent first sub-pixel columns, sub-pixels of a first color share one data signal line, or sub-pixels of a second color share one data signal line.

Exemplarily, with continued reference to FIG. 13, an example is used in which the first sub-pixel 11 in the third pixel unit 103, the third sub-pixel 13 in the third pixel unit 103, and the second sub-pixel 12 in the fourth pixel unit 104 belong to a same sub-pixel row 121; the second sub-pixel 12 in the third pixel unit 103, the third sub-pixel 13 in the fourth pixel unit 104, and the first sub-pixel 11 in the fourth pixel unit 104 belong to a same sub-pixel row 121. In two adjacent sub-pixel columns 111 and 112, first sub-pixels 11 belonging to the sub-pixel column 111 and first sub-pixels 11 belonging to the sub-pixel column 113 share one data signal line 231, and first pixels 11 and second pixels 12 belonging to a same sub-pixel column 111 are electrically connected to the data signal line 231 and the data signal line 232 on two opposite sides of the sub-pixel column 111, respectively. In this case, the number of the data signal lines 20 arranged in the display panel 100 can be reduced, and thus the aperture ratio of the display panel 100 can be improved.

It should be noted that FIG. 13 is only an exemplary view of an embodiment of the present disclosure, and FIG. 13 exemplarily shows that first sub-pixels 11 in two adjacent sub-pixel columns (the sub-pixel columns 111 and 113) share one data signal line, while in the embodiments of the present disclosure, it may also be implemented that second sub-pixels in two adjacent sub-pixel columns share one data signal line, and the technical principle is similar to that of the case shown in the FIG. 13, which will not be repeated here.

It should be understood that the embodiments of the present disclosure are exemplarily described by using an example in which three adjacent sub-pixels form one pixel unit, and four adjacent sub-pixels may also form one pixel unit in the embodiments of the present disclosure.

Figure 14:
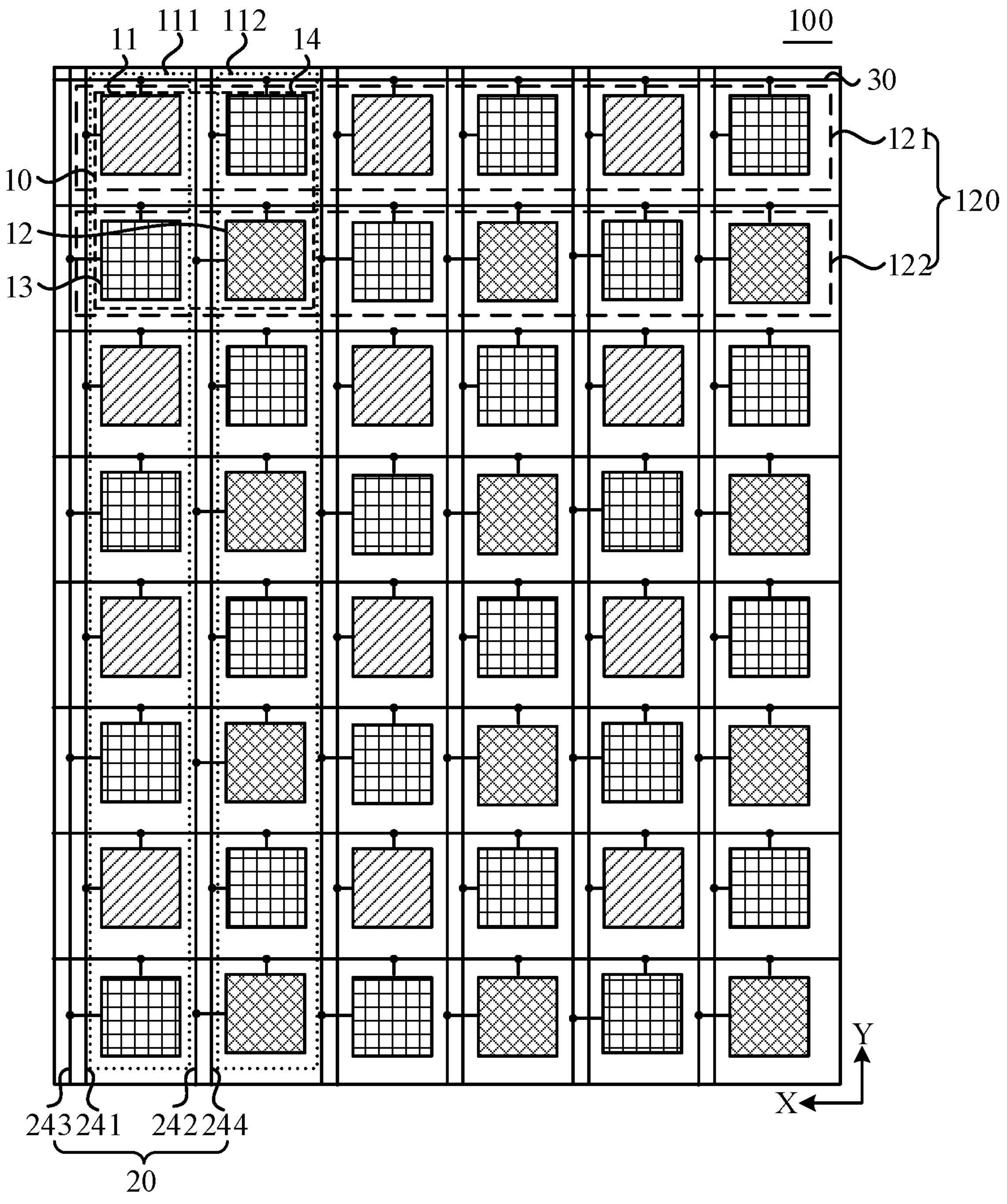
FIG. 14 is a schematic structural view of another display panel according to an embodiment of the present disclosure.

In an embodiment, FIG. 14 is a schematic structural view of another display panel according to an embodiment of the present disclosure. As shown in FIG. 14, multiple sub-pixels also constitute multiple sub-pixel rows 120. When each pixel unit 10 includes four sub-pixels, and the four sub-pixels in each pixel unit 10 are a first sub-pixel 11, a second sub-pixel 12, a third sub-pixel 13 and a fourth sub-pixel 14, respectively, the color of the first sub-pixel 11 is one of red, green or blue, the color of the second sub-pixel 12 is one of red, green or blue, and the color of the third sub-pixel 13 is one of red, green or blue; and the color of the first sub-pixel 11, the color of the second sub-pixel 12 and the color of the third sub-pixel 13 are different from each other. The color of the third sub-pixel 13 is the same as the color of the fourth sub-pixel 14. In a same pixel unit 10, the first sub-pixel 11 and the third sub-pixel 13 belong to a same sub-pixel column 111, the second sub-pixel 12 and the fourth sub-pixel 14 belong to a same sub-pixel column 112, the third sub-pixel 13 and the second sub-pixel 12 belong to a same sub-pixel row 122, and the fourth sub-pixel 14 and the first sub-pixel belong to a same sub-pixel row 121; where sub-pixels which belong to a same sub-pixel column (the sub-pixel column 111 or 112) and have a same color share one data signal line.

Exemplarily, the first sub-pixels 11 and the third sub-pixels 13 belonging to a same sub-pixel column 111 are electrically connected to a data signal line 241 and a data signal line 243, respectively, and the second sub-pixels 12 and the fourth sub-pixels 14 belonging to a same sub-pixel column 112 are electrically connected to a data signal line 242 and a data signal line 244, respectively. In this case, the data signal line 241 may transmit data signals to the first sub-pixels 11 in the time-division manner, the data signal line 242 may transmit data signals to the second sub-pixels 12 in the time-division manner, the data signal line 243 may transmit data signals to the third sub-pixels 13 in the time-division manner, and the data signal line 244 may transmit data signals to the fourth sub-pixels 14 in the time-division manner. In this case, each data signal line transmits data signals of sub-pixels of one color, such that the voltages of the data signals transmitted by each data signal line only have relatively small jump or no jump, thereby ensuring the accuracy of data signals transmitted to sub-pixels electrically connected to a same data signal line, and improving the display effect of the display panel.

In an embodiment, with continued reference to FIG. 14, the display panel 100 may further include multiple scan signal lines 30. When sub-pixels of a same color belonging to a same sub-pixel column share one data signal line, sub-pixels belonging to a same sub-pixel row 120 are electrically connected to different data signal lines, such that the sub-pixels belonging to the same sub-pixel row 120 share the scan signal lines 30, and thus each data signal line 20 transmits data signals to sub-pixels in a one-to-one correspondence manner and in the time-division manner.

Figure 15:
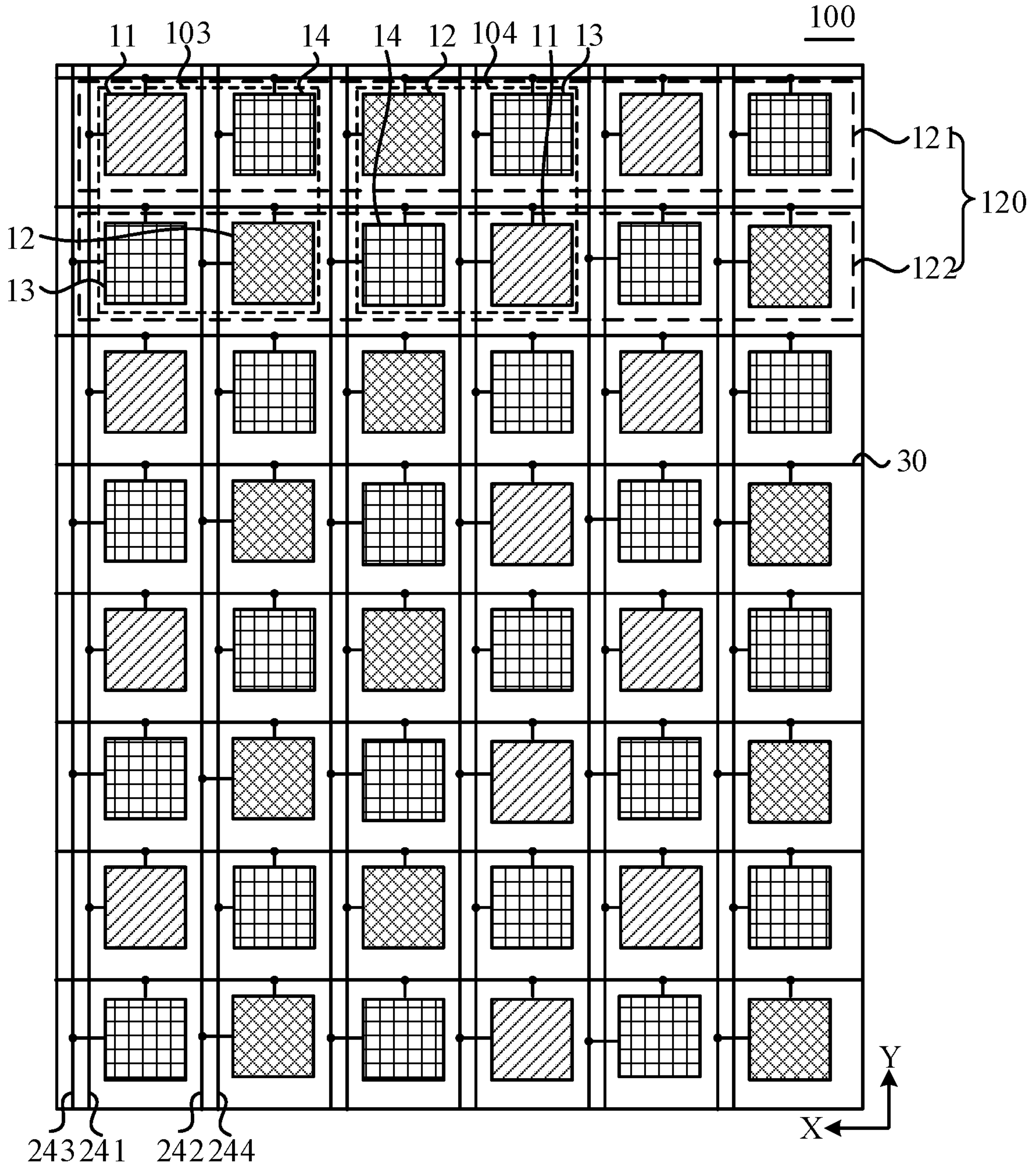
FIG. 15 is a schematic structural view of another display panel according to an embodiment of the present disclosure.

In an embodiment, FIG. 15 is a schematic structural view of another display panel according to an embodiment of the present disclosure. As shown in FIG. 15, two adjacent pixel units disposed in a same row are a third pixel unit 103 and a fourth pixel unit 104, respectively; the second sub-pixel 12 in the third pixel unit 103 and the fourth sub-pixel 14 in the fourth pixel unit 104 are adjacent to each other and belong to a same sub-pixel row 122; and the fourth sub-pixel 14 in the third pixel unit 103 and the second sub-pixel 12 in the fourth pixel unit 104 are adjacent to each other and belong to a same sub-pixel row 121. In this case, each sub-pixel row may include a red sub-pixel, a green sub-pixel and a blue sub-pixel, which is conducive to improving the display effect of the display panel 100.

In an embodiment, data signal lines disposed on two opposite sides of each sub-pixel column are electrically connected to two adjacent sub-pixels of different colors in this sub-pixel column, respectively.

Figure 16:
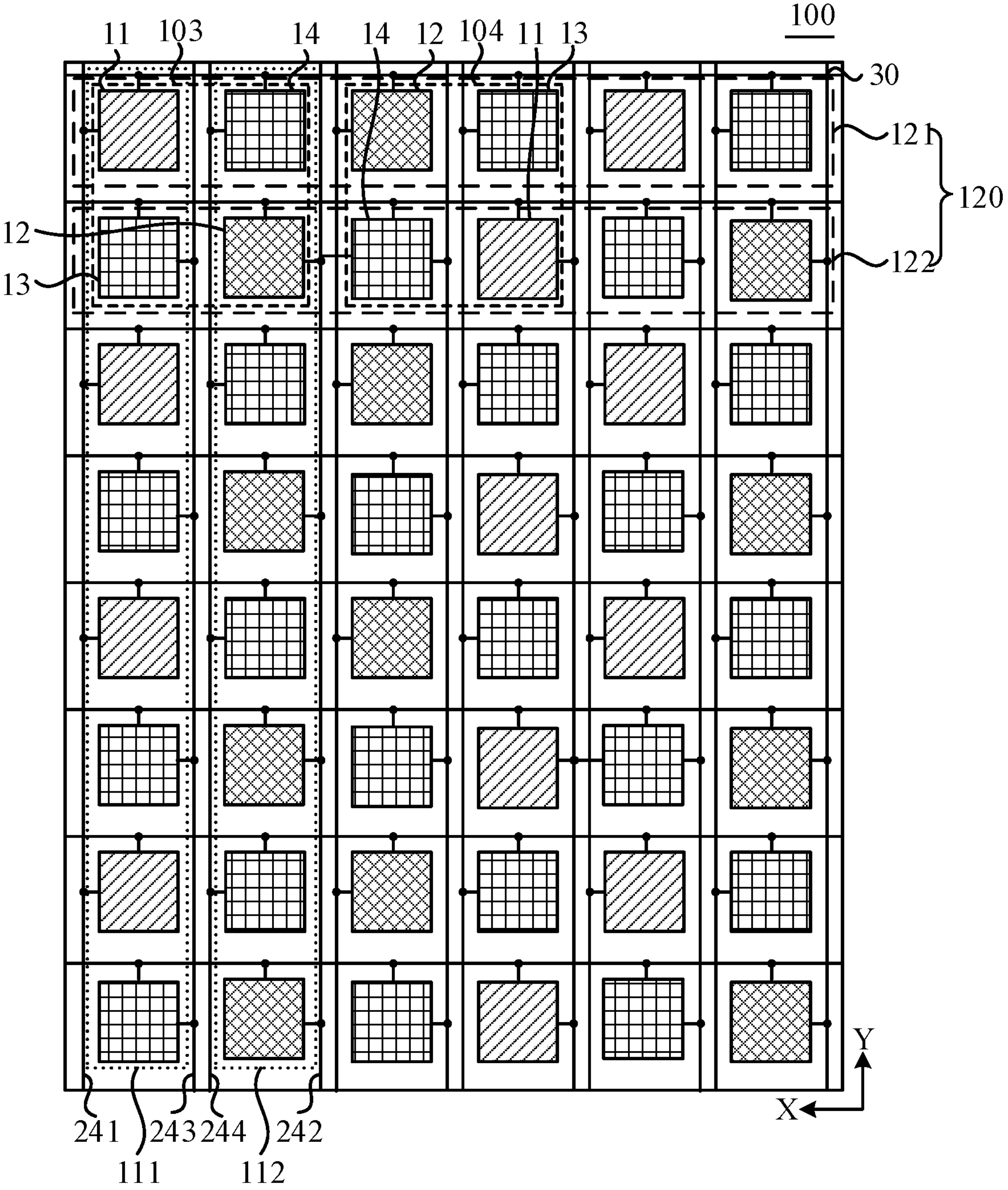
FIG. 16 is a schematic structural view of another display panel according to an embodiment of the present disclosure.

Exemplarily, FIG. 16 is a schematic structural view of another display panel according to an embodiment of the present disclosure. As shown in FIG. 16, the first sub-pixel 11 and the third sub-pixel 13 belonging to the sub-pixel column 111 are electrically connected to the data signal line 241 and the data signal line 243 disposed on two opposite sides of this sub-pixel column 111, respectively; and the second sub-pixel 12 and the fourth sub-pixel 14 belonging to the sub-pixel column 112 are electrically connected to the data signal line 242 and the data signal line 244 disposed on two opposite sides of this sub-pixel column 112, respectively. In this case, the data signal lines can be evenly distributed on two opposite sides of the sub-pixel column, which is conducive to the design of the display panel 100 and to simplifying the structure of the display panel 100.

In an embodiment, when each sub-pixel includes a pixel circuit, and the data signal lines on two opposite sides of each sub-pixel column are electrically connected to two adjacent sub-pixels of different colors in this sub-pixel column, respectively, pixel circuits of two adjacent sub-pixels belonging to a same sub-pixel column are centrally symmetric in structure.

Figure 17:
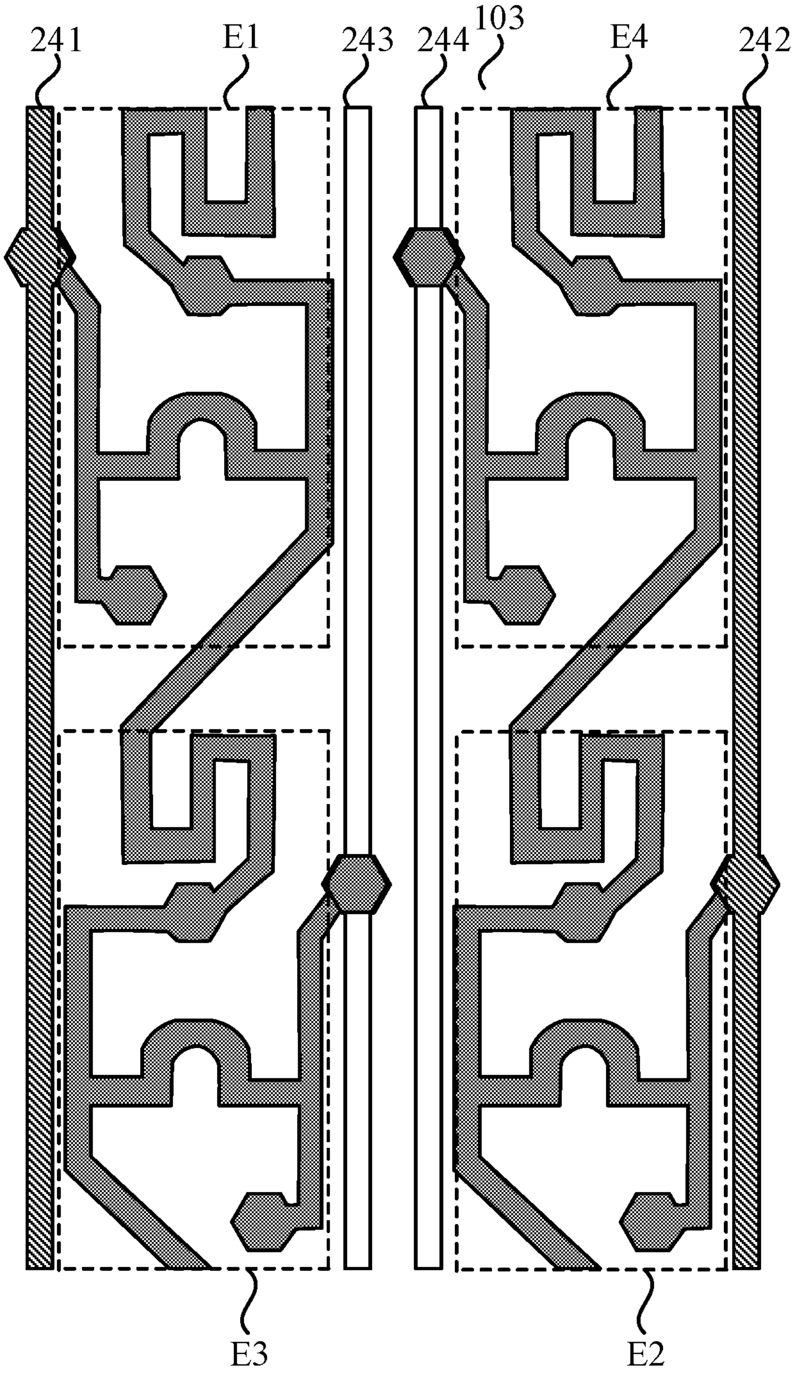
FIG. 17 is a partial schematic structural view of another display panel according to an embodiment of the present disclosure.

Exemplarily, FIG. 17 is a partial schematic structural view of another display panel according to an embodiment of the present disclosure. As shown in FIGS. 16 and 17, the first sub-pixel 11 includes a pixel circuit E1, the second sub-pixel 12 includes a pixel circuit E2, the third sub-pixel 13 includes a pixel circuit E3, and the fourth pixel circuit 14 includes a pixel circuit E4, and each pixel circuit may include at least one switch transistor. When pixel circuits of two adjacent sub-pixels (the sub-pixels 11 and 13; or the sub-pixels 12 and 14) belonging to a same sub-pixel column are centrally symmetric in structure, the layout and design of the pixel circuits can be facilitated, and thus the structure of the display panel 100 can be simplified.

An embodiment of the present disclosure further provides a display device, and the display device includes the display panel provided in the embodiments of the present disclosure. Therefore, the display device provided in the embodiments of the present disclosure has the technical features of the display panel provided in the embodiments of the present disclosure, so that the beneficial effects of the display panel provided in the embodiments of the present disclosure can be achieved. For the similarities, reference may be made to the above description of the display panel provided in the embodiments of the present disclosure, which will not be repeated here.

Figure 18:
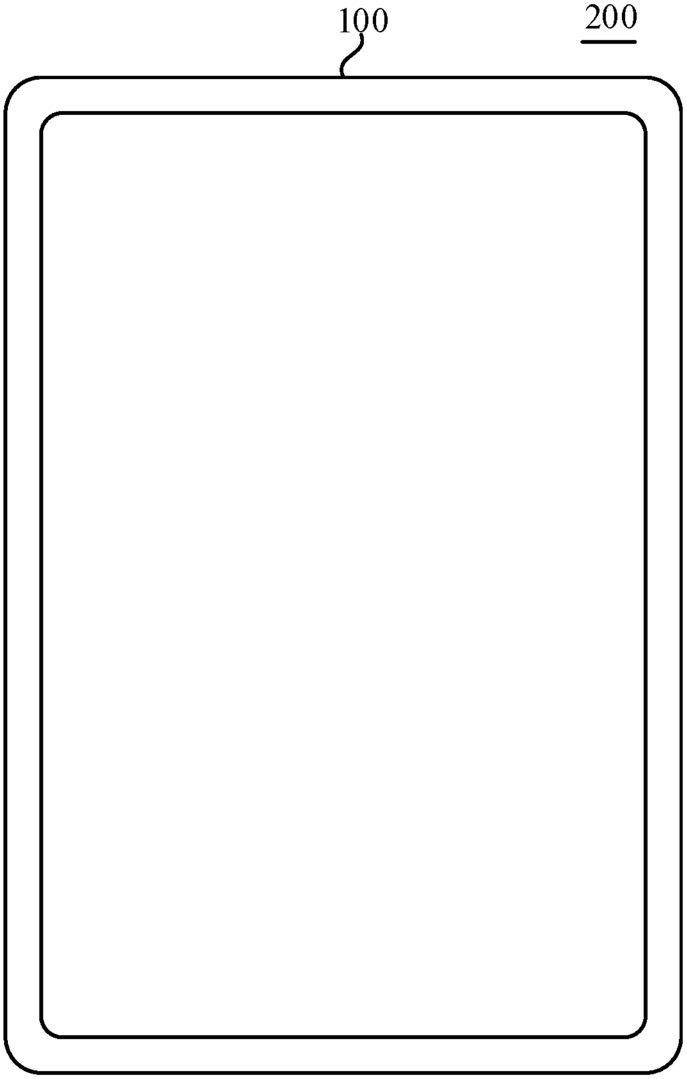
FIG. 18 is a schematic structural view of a display device according to an embodiment of the present disclosure.

Exemplarily, FIG. 18 is a schematic structural view of a display device according to an embodiment of the present disclosure. As shown in FIG. 18, a display device 200 includes the display panel 100. The display device 200 may be a portable device, a computer display, a vehicle-mounted display, a wearable device, or the like, which is not limited in the embodiments of the present disclosure.

It should be noted that the above are merely embodiments of the present disclosure and the technical principles applied therein. It should be understood for those skilled in the art that the present disclosure is not limited to the specific embodiments described herein. For those skilled in the art, various apparent modifications, adaptations, combinations and substitutions may be made without departing from the scope of the present disclosure. Therefore, although the present disclosure has been described in detail through the above embodiments, the present disclosure is not limited to the above embodiments and may include more other equivalent embodiments without departing from the invention concept of the present disclosure. The scope of the present disclosure is determined by the scope of the appended claims.

What is claimed is:

1. A display panel, comprising: a plurality of sub-pixels and a plurality of data signal lines;

wherein the plurality of sub-pixels constitute a plurality of sub-pixel columns; a sub-pixel column of the plurality of sub-pixel columns comprises a plurality of sub-pixels arranged in sequence; at least three adjacent sub-pixels form a pixel unit; and colors of sub-pixels in the pixel unit comprise red, green and blue; and wherein at least part of sub-pixels belonging to a same sub-pixel column share one data signal line; wherein a data signal line electrically connected to red sub-pixels is different from a data signal line electrically connected to blue sub-pixels, and a data signal line electrically connected to green sub-pixels is different from the data signal line electrically connected to the blue sub-pixels;

wherein in a case where every three adjacent sub-pixels form the pixel unit and three sub-pixels in a same pixel unit are a first sub-pixel, a second sub-pixel and a third sub-pixel, respectively, a color of the first sub-pixel is one of red, green or blue, a color of the second sub-pixel is one of red, green or blue, and a color of the third sub-pixel is one of red, green or blue; and the color of the first sub-pixel, the color of the second sub-pixel and the color of the third sub-pixel are different from each other;

two adjacent pixel units disposed in a same column are a first pixel unit and a second pixel unit, respectively; the first sub-pixel in the first pixel unit, the second sub-pixel in the first pixel unit and the third sub-pixel in the second pixel unit belong to a same sub-pixel column, and the third sub-pixel in the first pixel unit, the first sub-pixel in the second pixel unit and the second sub-pixel in the second pixel unit belong to a same sub-pixel column; and in each sub-pixel column, red sub-pixels and green sub-pixels share one data signal line; and blue sub-pixels belonging to a same sub-pixel column share one data signal line.

2. The display panel of claim 1, wherein the sub-pixels in the pixel unit are disposed in respective two adjacent sub-pixel columns, and two sub-pixels, among the sub-pixels in a same pixel unit, of different colors belong to a same sub-pixel column.

3. The display panel of claim 1, wherein blue sub-pixels in two adjacent sub-pixel columns share one data signal line.

4. The display panel of claim 1, further comprising: a plurality of scan signal lines;

an arrangement manner of the sub-pixels in each of pixel units disposed in a same row is the same; and the sub-pixels in each of pixel units disposed in a same row share one scan signal line.

5. The display panel of claim 1, wherein in a same pixel unit, an orthographic projection of the first sub-pixel in a direction perpendicular to a column direction and an orthographic projection of the second sub-pixel in the direction perpendicular to the column direction each have an overlap with an orthographic projection of the third sub-pixel in the direction perpendicular to the column direction.

6. The display panel of claim 5, wherein an orthographic projection of the second sub-pixel in the first pixel unit in the direction perpendicular to the column direction has an overlap with an orthographic projection of the first sub-pixel in the second pixel unit in the direction perpendicular to the column direction.

7. A display panel, comprising: a plurality of sub-pixels and a plurality of data signal lines; wherein at least three adjacent sub-pixels form a pixel unit, and sub-pixels in a same pixel unit comprise a first sub-pixel, a second sub-pixel and a third sub-pixel;

wherein at least part of sub-pixels which belong to a same sub-pixel column and have a same color share one data signal line; or, at least part of first sub-pixels belonging to a same sub-pixel column share one data signal line, and at least part of second sub-pixels belonging to a same sub-pixel column share one data signal line;

wherein the plurality of sub-pixel columns comprises a second sub-pixel column, the second sub-pixel column comprises a plurality of third sub-pixels, and the plurality of third sub-pixels comprises a first type of third sub-pixels and a second type of third sub-pixels alternately arranged in sequence;

wherein the first type of third sub-pixels and the second type of third sub-pixels share one data signal line; or the plurality of data signal lines comprises a third data signal line and a fourth data signal line, wherein the third data signal line is electrically connected to the first type of third sub-pixels and the fourth data signal line is electrically connected to the second type of third sub-pixels.

8. The display panel of claim 7, wherein the plurality of sub-pixel columns comprises a first sub-pixel column, and the first sub-pixel column comprises first sub-pixels and second sub-pixels alternately arranged in sequence; and the plurality of data signal lines comprises a first data signal line and a second data signal line, wherein the first data signal line is electrically connected to at least part of first sub-pixels in the first sub-pixel column, and the second data signal line is electrically connected to at least part of second sub-pixels in the first sub-pixel column.

9. The display panel of claim 8, wherein the first data signal line and the second data signal line are located on two opposite sides of the first sub-pixel column, or the first data signal line and the second data signal line are located on a same side of the first sub-pixel column.

10. The display panel of claim 7, wherein in a case where the plurality of data signal lines comprises the third data signal line and the fourth data signal line, the third data signal line and the fourth data signal line are located on two opposite sides of the second sub-pixel column, or the third data signal line and the fourth data signal line are located on a same side of the second sub-pixel column.

11. The display panel of claim 7, wherein the first type of third sub-pixels are located in odd-numbered rows and the second type of third sub-pixels are located in even-numbered rows.

12. The display panel of claim 7, further comprising: a plurality of scan signal lines, and the plurality of scan signal lines comprises a first scan signal line and a second scan signal line; wherein a plurality of third sub-pixels and a plurality of first sub-pixels belong to a first sub-pixel row, a plurality of third sub-pixels and a plurality of second sub-pixels belong to a second sub-pixel row; wherein the first sub-pixel row overlaps the second sub-pixel row, or the first sub-pixel row does not overlap the second sub-pixel row; and the first scan signal line is electrically connected to at least part of sub-pixels in the first sub-pixel row, and the second scan signal line is electrically connected to at least part of sub-pixels in the second sub-pixel row.

13. The display panel of claim 7, wherein a projection of the first scan signal line in a direction perpendicular to a substrate does not overlap a projection of the second scan signal line in a direction perpendicular to the substrate.

* * * * *